(12) United States Patent
Imai et al.

(10) Patent No.: US 9,485,810 B2
(45) Date of Patent: Nov. 1, 2016

(54) HANDLER AND INSPECTION APPARATUS

(71) Applicant: Seiko Epson Corporation, Tokyo (JP)

(72) Inventors: Takayuki Imai, Matsumoto (JP);
Haruhiko Miyamoto, Shiojiri (JP);
Fuyumi Takata, Matsumoto (JP);
Toshioki Shimojima, Suwa (JP)

(73) Assignee: Seiko Epson Corporation (JP)

( * ) Notice: Subject to any disclaimer, the term of this patent is extended or adjusted under 35 U.S.C. 154(b) by 151 days.

(21) Appl. No.: 14/200,634

(22) Filed: Mar. 7, 2014

(65) Prior Publication Data

US 2014/0312924 A1  Oct. 23, 2014

(30) Foreign Application Priority Data

Apr. 23, 2013  (JP) ................................. 2013-090050

(51) Int. Cl.
| | | |
|---|---|---|
| *H05B 3/60* | (2006.01) | |
| *G01R 31/28* | (2006.01) | |
| *H05B 1/02* | (2006.01) | |

(52) U.S. Cl.
CPC ............. *H05B 3/60* (2013.01); *G01R 31/2893* (2013.01); *H05B 1/0269* (2013.01)

(58) Field of Classification Search
None
See application file for complete search history.

(56) References Cited

U.S. PATENT DOCUMENTS

| | | | | | |
|---|---|---|---|---|---|
| 5,325,052 | A | * | 6/1994 | Yamashita | G01R 1/06738 324/750.08 |
| 6,104,204 | A | * | 8/2000 | Hayama | G01R 1/0458 324/750.08 |
| 6,445,203 | B1 | * | 9/2002 | Yamashita | G01R 31/2856 324/750.08 |
| 6,741,090 | B2 | * | 5/2004 | Yamashita | G01R 1/0408 324/750.08 |
| 7,100,389 | B1 | * | 9/2006 | Wayburn | G01R 31/2874 324/750.08 |
| 8,274,300 | B2 | * | 9/2012 | Sakaue | G01R 31/2875 165/247 |
| 2005/0151553 | A1 | * | 7/2005 | Kabbani | G01R 31/2891 324/750.08 |
| 2013/0057310 | A1 | | 3/2013 | Hasegawa et al. | |

FOREIGN PATENT DOCUMENTS

| | | |
|---|---|---|
| JP | 03-137579 | 6/1991 |
| TW | 201312134 A | 3/2013 |

* cited by examiner

*Primary Examiner* — Paresh Patel
(74) *Attorney, Agent, or Firm* — Harness, Dickey & Pierce, P.L.C.

(57) ABSTRACT

A handler includes: a rotating section which is a holding unit mounting section which can take a mounted state in which a holding unit for holding an IC device is mounted; and a transportation mechanism which transports the IC device held by the holding unit. The rotating section includes a heat generation section which generates heat and a heating flow path through which fluid which is heated by the heat generation section and is used for heating of the IC device passes.

19 Claims, 15 Drawing Sheets

HANDLER AND INSPECTION APPARATUS

This application claims priority to Japanese Patent Application No. 2013-090050, filed Apr. 23, 2013, the entirety of which is hereby incorporated by reference.

BACKGROUND

1. Technical Field

The present invention relates to a handler and an inspection apparatus.

2. Related Art

In the related art, there has been known an electronic component testing apparatus which inspects electrical properties of an electronic component such as an IC device, for example (hereinafter, also referred to as "electrical inspection") (for example, see JP-A-3-137579).

In the electronic component testing apparatus disclosed in JP-A-3-137579, when performing the electrical inspection, the electrical inspection may be performed by heating the electronic component, that is, in an environment with a high temperature. As a configuration of heating the electronic component, the electronic component testing apparatus has a configuration of including a chamber which is provided on an adsorption chuck for holding the electronic component, and a thermal conductive plate which is disposed in the chamber. High temperature air, which is previously heated before flowing into the chamber, flows into the chamber. The high temperature air directly blows to the held electronic component to heat the electronic component. The thermal conductive plate is heated by the high temperature air and heats the electronic component with radiant heat.

However, in the electronic component testing apparatus having such a heating configuration, since the high temperature air is previously heated before flowing into the chamber at a downstream side thereof, the air gets gradually cooled on the way to the chamber, and as a result, it is difficult to heat the electronic component at a predetermined temperature.

SUMMARY

An advantage of some aspects of the invention is to provide a handler which can rapidly and uniformly heat an object, and an inspection apparatus.

An aspect of the invention is directed to a handler including: a holding unit mounting section which takes a mounted state in which a holding unit for holding a transportation object is mounted; and a transportation mechanism which transports the transportation object held by the holding unit, in which the holding unit mounting section includes a heat generation section which generates heat and a flow path through which fluid which is heated by the heat generation section and used for heating of the transportation object passes.

With this configuration, it is possible to rapidly and uniformly heat the object.

In the handler according to the aspect of the invention, it is preferable that the holding unit mounting section includes an abutting surface which abuts the holding unit, and the flow path includes a supply port which is opened to the abutting surface and supplies the fluid to the holding unit.

With this configuration, it is possible to rapidly supply the fluid, which is heated to have a predetermined temperature, to the holding unit.

In the handler according to the aspect of the invention, it is preferable that bent or curved portions is included in the middle of the flow path.

With this configuration, it is possible to secure a maximum length of a path through which the fluid passes, and thus it is possible to sufficiently heat the fluid while the fluid passes through the flow path.

In the handler according to the aspect of the invention, it is preferable that the flow path is meandered.

With this configuration, it is possible to secure a maximum length of a path through which the fluid passes, and thus it is possible to sufficiently heat the fluid while the fluid passes through the flow path.

In the handler according to the aspect of the invention, it is preferable that the holding unit mounting section includes a main body section in which the flow path and the heat generation section are provided, and heat generated by the heat generation section is transferred to the holding unit through the main body section to heat the transportation object.

With this configuration, it is possible to more rapidly and uniformly heat the object with a synergetic effect between the fluid heated by the heat generation section and the heat transferred to the holding unit.

In the handler according to the aspect of the invention, it is preferable that the heat generation section generates heat by conduction of electricity.

With this configuration, it is possible to easily perform control of the operation of the heat generation section and stopping thereof, and thus it is possible to heat the fluid which flows down through the flow path at predetermined timing.

In the handler according to the aspect of the invention, it is preferable that the heat generation section is configured with a heater which has a rod-like shape and is disposed along a horizontal direction.

With this configuration, it is possible to have the heat generation section including a plurality of portions adjacent to the flow path as much as possible, and thus it is possible to sufficiently heat the fluid while the fluid passes through the flow path. In addition, it is easy to secure the flow path in a vertical direction.

In the handler according to the aspect of the invention, it is preferable that the handler further includes: a heat exchange section which is disposed on upstream of the flow path, and performs heating or cooling with respect to the fluid before the fluid approaches the flow path.

With this configuration, it is possible to more reliably perform temperature adjustment of the fluid.

In the handler according to the aspect of the invention, it is preferable that the handler further includes: a fluid supply source which supplies the fluid to the flow path; and a switch section which is disposed between the fluid supply source and the flow path, and switches the supply or stopping of the supply of the fluid from the fluid supply source.

With this configuration, it is possible to prevent wasting of the fluid which continues to be supplied even when the holding unit does not hold the object.

In the handler according to the aspect of the invention, it is preferable that the switch section switches the state to a state in which the supply can be performed, when the holding unit holds the object.

With this configuration, it is possible to prevent wasting of the fluid which continues to be supplied even when the holding unit does not hold the object.

In the handler according to the aspect of the invention, it is preferable that the fluid is compressed air.

With this configuration, it is possible to supply the compressed air as the fluid to reliably approach the holding unit.

In the handler according to the aspect of the invention, it is preferable that the holding unit mounting section includes a second flow path which is provided separately from the flow path, the holding unit includes an adsorption member which has a tubular shape including an inner cavity portion and adsorbs and holds the object, and the inner cavity portion is connected to a suction member which sucks the inner cavity portion through the second flow path.

With this configuration, it is possible to have the handler including a transportation section which transports the object held by the adsorption member, for example.

In the handler according to the aspect of the invention, it is preferable that the handler further includes a socket installing portion which can install a socket for loading the transportation object and the transportation mechanism is configured to transport the object to the socket on which the transportation object is not yet loaded.

With this configuration, it is possible to load the object transported by the transportation mechanism to the socket to perform the inspection, when the inspection with respect to the object can be performed on the socket installed in the socket installing portion, for example.

Another aspect of the invention is directed to an inspection apparatus including: the handler according to the aspect of the invention; and a holding unit which is mounted on the holding unit mounting section.

With this configuration, it is possible to rapidly and uniformly heat the object.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a handler and an inspection apparatus of the invention will be described in detail based on preferred embodiments shown in the accompanied drawings.

First Embodiment

Figure 1:
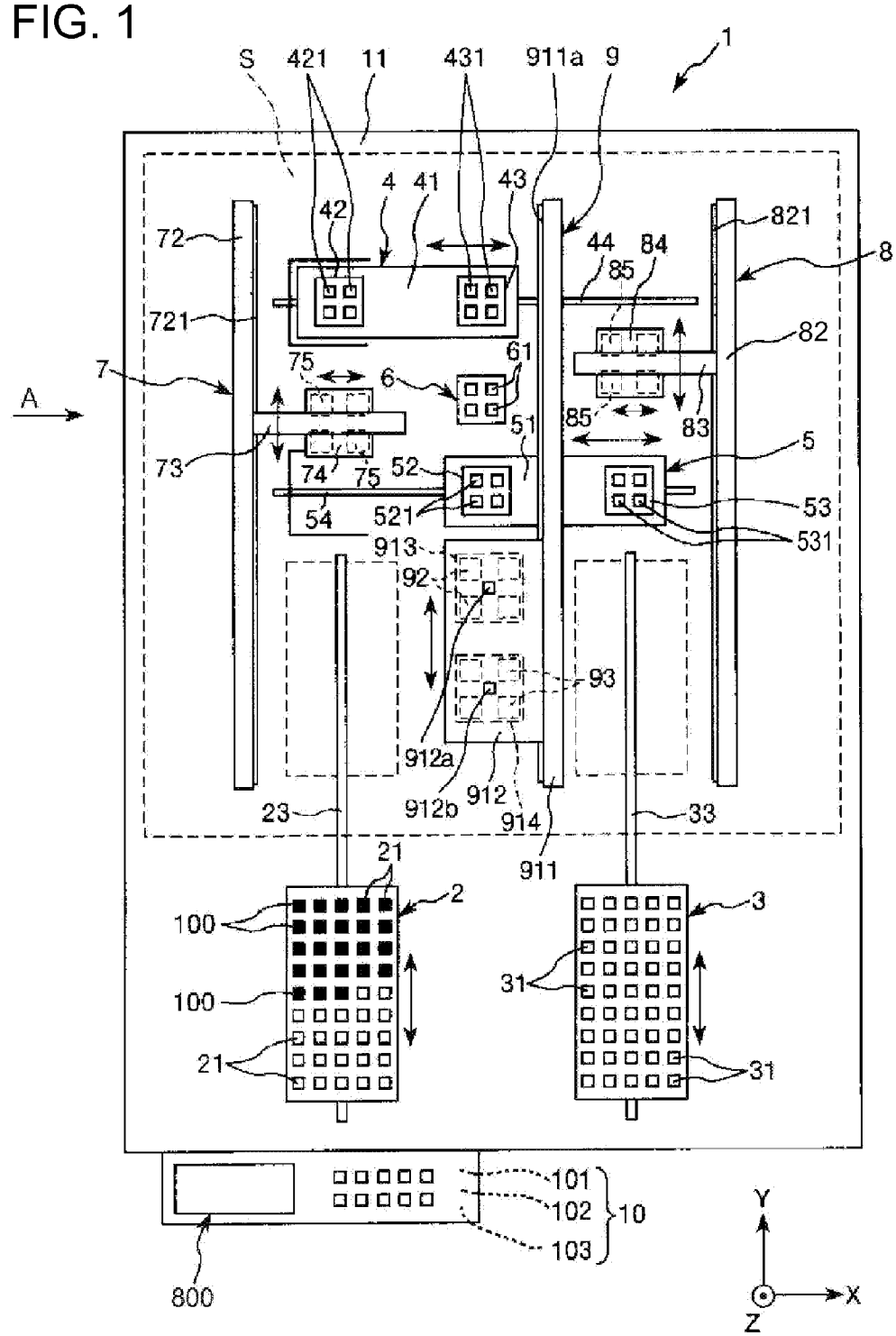
FIG. 1 is a schematic plan view showing a first embodiment of an inspection apparatus (handler) of the invention.
Figure 2:
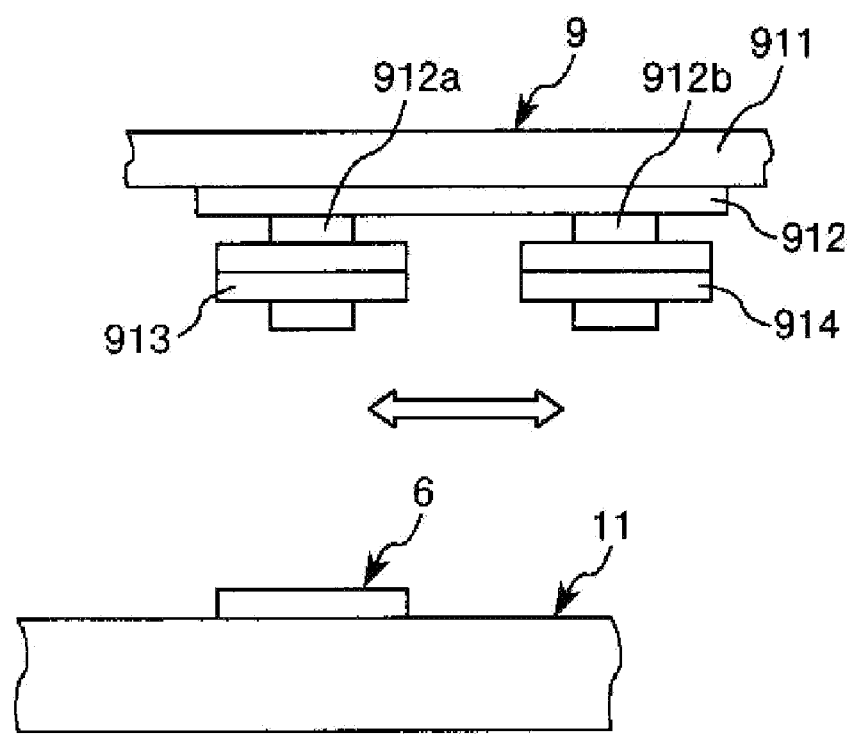
FIG. 2 is a diagram (side view) which is seen from an arrow A direction of FIG. 1.
Figure 3:
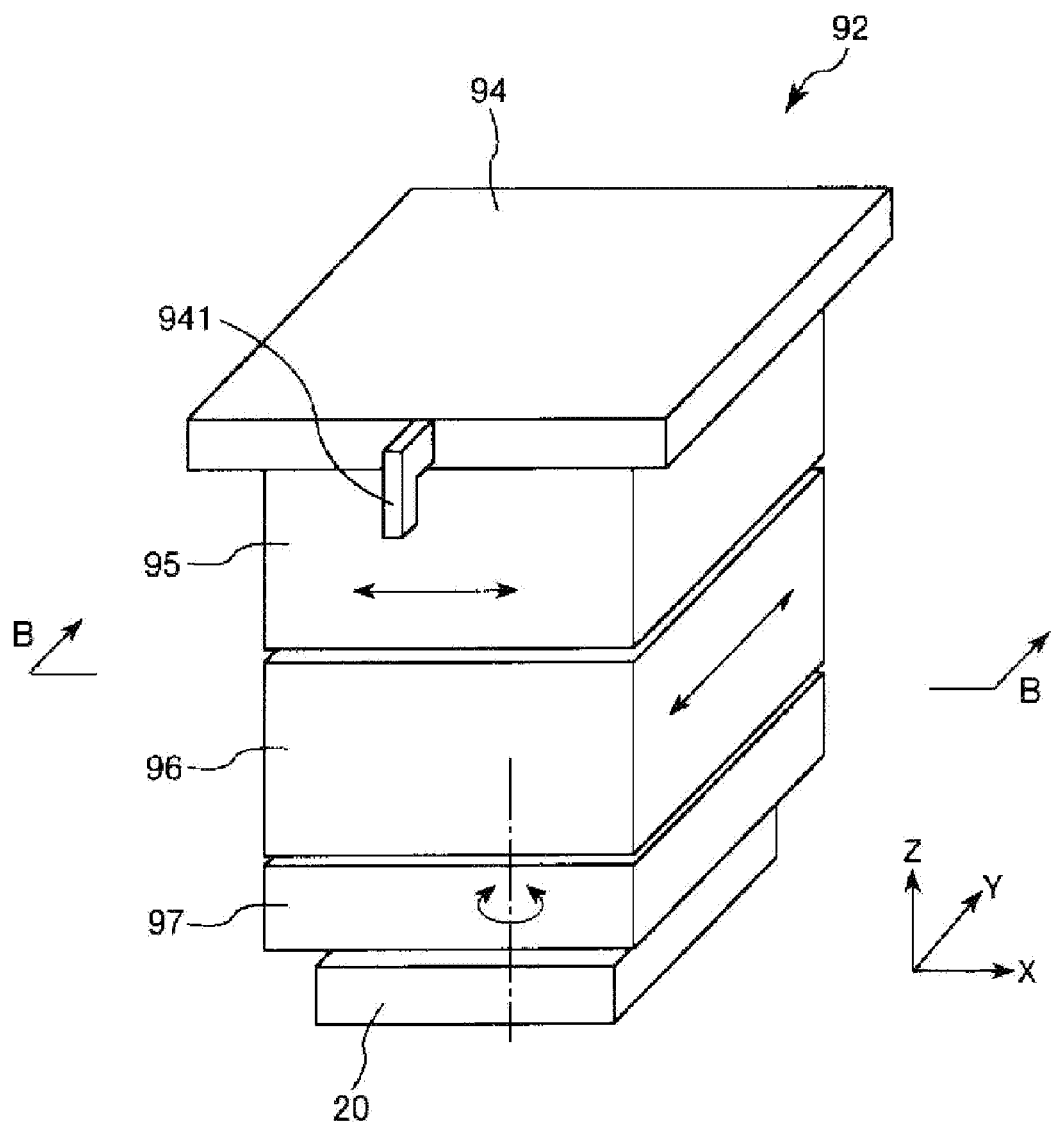
FIG. 3 is a schematic perspective view of a first hand unit included by an inspection robot of an inspection apparatus shown in FIG. 1.
Figure 4:
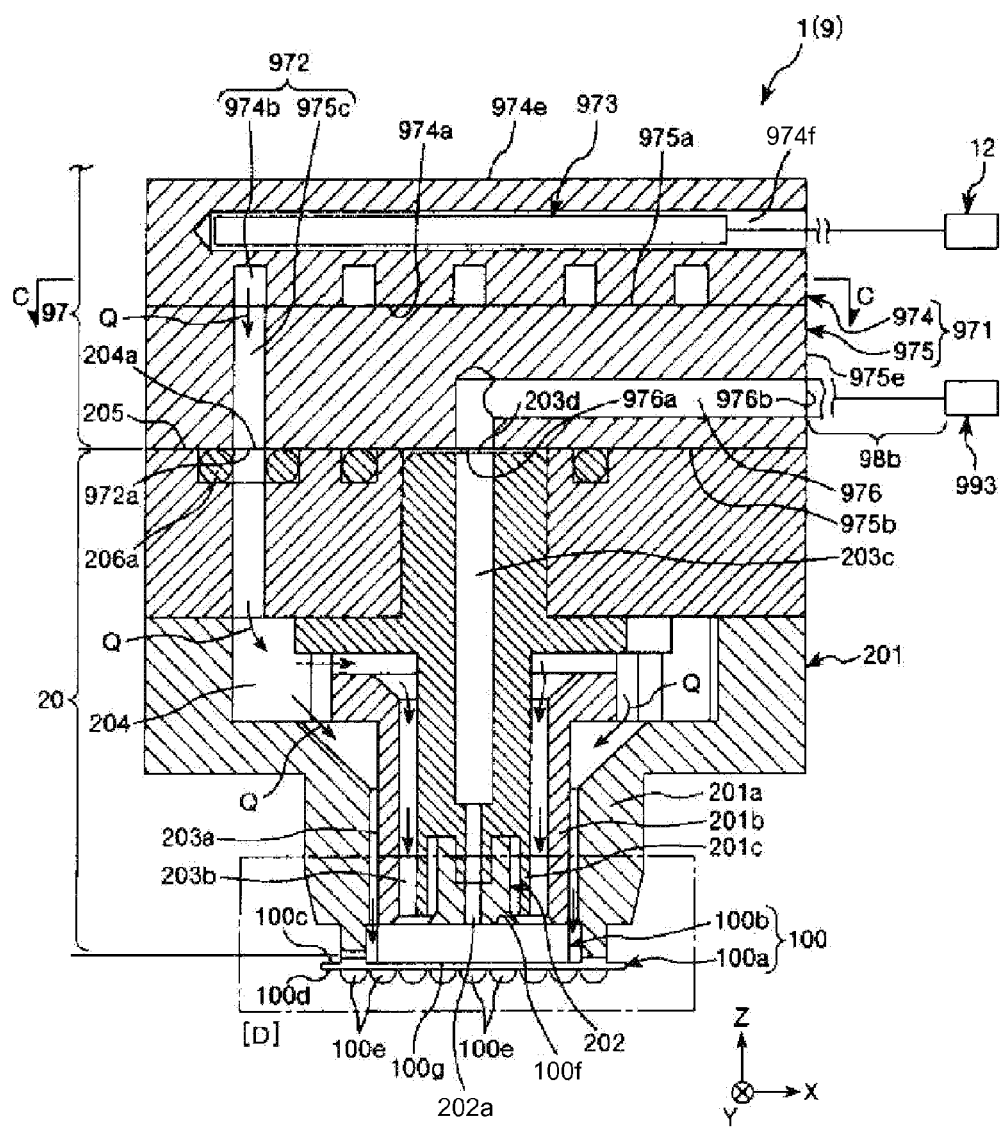
FIG. 4 is a cross-sectional view taken along line B-B of FIG. 3.
Figure 5:
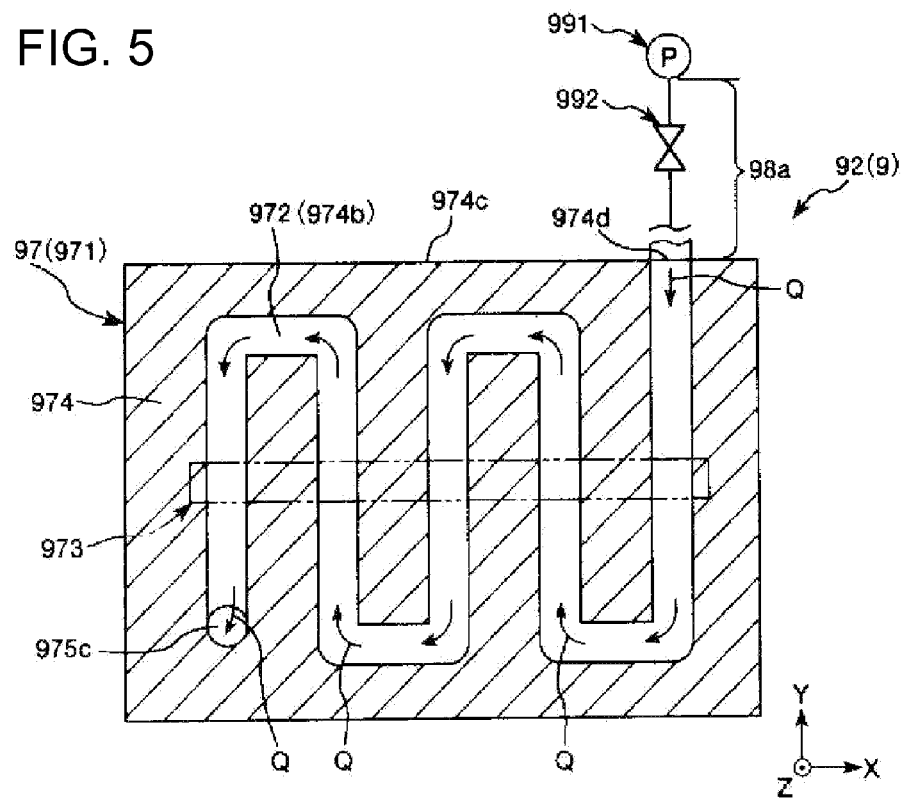
FIG. 5 is a cross-sectional view taken along line C-C of FIG. 4.
Figure 6:
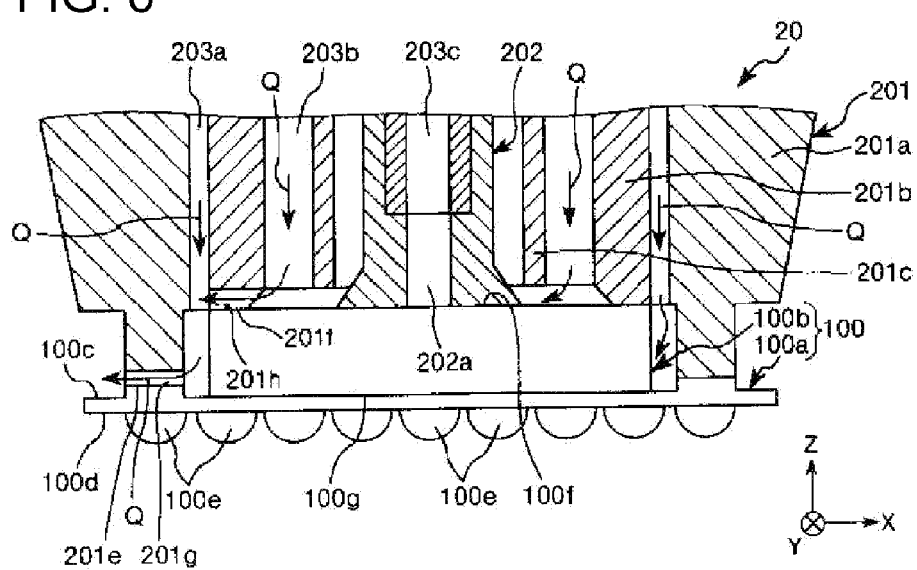
FIG. 6 is an enlarged specific diagram of a region surrounded by a dashed line of FIG. 4.

FIG. 1 is a schematic plan view showing a first embodiment of an inspection apparatus (handler) of the invention, FIG. 2 is a diagram (side view) which is seen from an arrow A direction of FIG. 1, FIG. 3 is a schematic perspective view of a first hand unit included in an inspection robot of the inspection apparatus shown in FIG. 1, FIG. 4 is a cross-sectional view taken along line B-B of FIG. 3, FIG. 5 is a cross-sectional view taken along line C-C of FIG. 4, FIG. 6 is an enlarged specific diagram of a region [D] surrounded by a dashed line of FIG. 4, and FIGS. 7 to 15 are plan views illustrating inspection procedures of an electronic component performed by the inspection apparatus shown in FIG. 1.

Hereinafter, for convenience of description, as shown in FIG. 1, three axes which intersect each other are set as an X axis (first axis), a Y axis (second axis), and a Z axis (third axis). A direction parallel with the X axis is referred to as an "X direction (first direction)", a direction parallel with the Y axis is referred to as a "Y direction (second direction)", and a direction parallel with the Z axis is referred to as a "Z direction (third direction)". In each direction of the X direction, the Y direction, and the Z direction, a direction of an arrow is referred to as a "positive direction" and the opposite direction is referred to as a "negative direction". In addition, the positive Z direction is referred to as an "upper portion" and the negative Z direction is referred to as a "lower portion".

The inspection apparatus 1 shown in FIG. 1 and FIGS. 7 to 15 is a device for inspecting (testing) electrical properties of a test component (electronic component), for example, an integrated circuit (IC) device, a liquid crystal display (LCD), or a contact image sensor (CIS), as an inspection object (transportation object). Hereinafter, for convenience of description, as the test component, a case of using an IC device 100 will be described as a representative. The inspection of the electrical properties with respect to the IC device 100 is referred to as "electrical inspection".

As shown in FIGS. 4 and 5, the IC device 100 is an IC chip which is generally called a "package on package (PoP) device" including a first package 100a and a second package 100b loaded on the first package 100a.

A plurality of electrodes (not shown) are disposed on an upper surface (front side surface) 100c of the first package 100a, and a plurality of electrodes 100e are also disposed on a lower surface (rear side surface) 100d thereof. When performing the electrical inspection, an electrode on a tester side (inspection socket 6 side) comes in contact with each electrode from both surface sides of the IC device 100 to perform the electric inspection.

A product number (not shown), for example, is printed on an upper surface (front side surface) 100f of the second package 100b. A plurality of electrodes (not shown) electrically connected to the electrodes 100e through conductor posts (not shown) provided on the first package 100a, are disposed on a lower surface (rear side surface) 100g of the second package 100b.

In the electrical inspection, the inspection may be performed by heating the IC device 100, that is, in an environment at a high temperature. A configuration of heating the IC device 100 will be described later.

The inspection apparatus 1 includes a supply tray 2, a collection tray 3, a first shuttle 4, a second shuttle 5, an inspection socket which is an inspection section (socket) 6, a supply robot 7, a collection robot 8, an inspection robot (transportation mechanism) 9, a holding unit 20, a display device (display section) 800, and a control device (control section) 10 which performs control of each section.

In such an inspection apparatus 1, a handler (handler according to the invention) for executing transportation of the IC device 100 is configured with a configuration excluding the inspection socket 6 and the holding unit 20 from the sections thereof, that is, by the supply tray 2, the collection tray 3, the first shuttle 4, the second shuttle 5, the supply robot 7, the collection robot 8, the inspection robot 9, the display device 800, and the control device 10. The configuration of the handler according to the invention is not limited thereto, and at least one of the sections may be omitted or other configurations (for example, a hot plate or a chamber) may be added thereto, if necessary.

Each of the inspection socket 6 and the holding unit 20 is a so-called "change kit" which is exchanged depending on types of inspection objects. In the embodiment, the inspection socket 6 and the holding unit 20 are set to be suitable for the IC device 100 which is a PoP device.

The inspection apparatus 1 includes a base 11 on which each section is loaded, and a safety cover (not shown) covered on the base 11 so as to accommodate each section, the first shuttle 4, the second shuttle 5, the inspection socket 6, the supply robot 7, the collection robot 8, and the inspection robot 9 are disposed inside the safety cover (hereinafter, referred to as a "region S"), and the supply tray 2 and the collection tray 3 are disposed so as to be moved in and out of the region S.

Hereinafter, each section will be described in detail in order.

The supply tray 2 is a tray for transporting the IC devices 100 to be inspected into the region S from the outside of the region S. As shown in FIG. 1, the supply tray 2 has a plate shape, and a plurality of pockets 21 for holding the IC devices 100 are formed on an upper surface thereof in a matrix shape in the X direction and the Y direction.

The supply tray 2 is loaded on a stage (not shown) which moves on a rail 23 extending in the Y direction to cross the inside and the outside of the region S. Since the stage moves by a driving section (not shown) using a linear motor as a driving source, for example, the supply tray 2 can reciprocate in the positive and negative Y directions along the rail 23. Accordingly, an operation of loading the supply tray 2 accommodating the IC devices 100 on a stage located outside the region S, moving the supply tray 2 into the region S with the stage, and moving the supply tray 2 to the outside of the region S with the stage again after removing all IC devices 100 from the supply tray 2, can be repeatedly performed.

The collection tray 3 is a tray for accommodating the IC devices 100 which completed the electrical inspection and transporting the IC devices to the outside of the region S from the inside of the region S. As shown in FIG. 1, the collection tray 3 has a plate shape, and a plurality of pockets 31 for holding the IC devices 100 are formed on an upper surface thereof in a matrix shape in the X direction and the Y direction.

The collection tray 3 is loaded on a stage (not shown) which moves on a rail 33 extending in the Y direction to cross the inside and the outside of the region S. Since the stage moves by a driving section (not shown) using a linear motor as a driving source, for example, the collection tray 3 can reciprocate in the positive and negative Y directions along the rail 33. Accordingly, an operation of accommodating the inspected IC devices 100 in the collection tray 3, moving the collection tray 3 to the outside of the region S, and moving the collection tray 3 into the region S again after exchanging the collection tray 3 on the stage with an empty tray, can be repeatedly performed.

Such a collection tray 3 is provided to be separated from the supply tray 2 described above in the positive X direction, and the first shuttle 4, the second shuttle 5, and the inspection socket 6 are disposed between the supply tray 2 and the collection tray 3.

The first shuttle 4 is for further transporting the IC devices 100 transported into the region S by the supply tray 2 to the vicinity of the inspection socket 6, and also for transporting the inspected IC devices 100 which are subjected to the electric inspection by the inspection socket 6 to the vicinity of the collection tray 3.

As shown in FIG. 1, the first shuttle 4 includes a base member 41, and two trays 42 and 43 which are fixed to the base member 41. The two trays 42 and 43 are provided to be arranged in the X direction. Four pockets 421 and four pockets 431 for holding the IC devices 100 are formed on upper surfaces of the trays 42 and 43 respectively in a matrix shape with 2 columns in the X direction and 2 rows in the Y direction.

Among the trays 42 and 43, the tray 42 positioned on the supply tray 2 side is a tray for receiving and accommodating the IC devices 100 accommodated in the supply tray 2, and the tray 43 positioned on the collection tray 3 side is a tray for accommodating the IC devices 100 which are subjected to the inspection of the electrical properties by the inspection socket 6. That is, the tray 42 is a tray for accommodating the uninspected IC devices 100 and the tray 43 is a tray for accommodating the inspected IC devices 100.

The base member 41 is supported by a rail 44 extending in the X direction, and the first shuttle 4 can reciprocate in the positive and negative X directions along the rail 44 by a driving section (not shown) using a linear motor as a driving source, for example. Accordingly, the first shuttle 4 is moved in the negative X direction, the tray 42 is arranged on the positive Y direction side with respect to the supply tray 2, and the tray 43 is arranged on the positive Y direction side with respect to the inspection socket 6 (see FIGS. 1, 7, 8, 11, 12, 14, and 15). In addition, the first shuttle 4 is moved in the positive X direction, the tray 43 is arranged on the positive Y direction side with respect to the collection tray 3, and the tray 42 is arranged on the positive Y direction side with respect to the inspection socket 6 (see FIGS. 9, 10, and 13).

The second shuttle 5 has the same function and configuration as those of the first shuttle 4 described above. That is, the second shuttle 5 is for further transporting the IC devices 100 transported into the region S by the supply tray 2 to the vicinity of the inspection socket 6, and also for transporting the inspected IC devices 100 which are inspected by the inspection socket 6 to the vicinity of the collection tray 3.

As shown in FIG. 1, the second shuttle 5 includes a base member 51, and two trays 52 and 53 which are fixed to the base member 51. The two trays 52 and 53 are provided to be arranged in the X direction. Four pockets 521 and four pockets 531 for holding the IC devices 100 are formed on upper surfaces of the trays 52 and 53 respectively in a matrix shape with 2 columns in the X direction and 2 rows in the Y direction.

Among the trays 52 and 53, the tray 52 positioned on the supply tray 2 side is a tray for receiving and accommodating the IC devices 100 accommodated in the supply tray 2, and the tray 53 positioned on the collection tray 3 side is a tray for accommodating the IC devices 100 which are subjected to the inspection of the electrical properties by the inspection socket 6. That is, the tray 52 is a tray for accommodating the uninspected IC devices 100 and the tray 53 is a tray for accommodating the inspected IC devices 100.

The base member 51 is supported by a rail 54 extending in the X direction, and the second shuttle 5 can reciprocate in the positive and negative X directions along the rail 54 by a driving section (not shown) using a linear motor as a driving source, for example. Accordingly, the second shuttle 5 is moved in the negative X direction, the tray 52 is arranged on the positive Y direction side with respect to the supply tray 2, and the tray 53 is arranged on the negative Y direction side with respect to the inspection socket 6 (see FIGS. 7, 8, and 12 to 14). In addition, the second shuttle 5 is moved in the positive X direction, the tray 53 is arranged on the positive Y direction side with respect to the collection tray 3, and the tray 52 is arranged on the negative Y direction side with respect to the inspection socket 6 (see FIGS. 1, 9 to 11, and 15).

The second shuttle 5 is provided to be separated from the first shuttle 4 described above in the negative Y direction, and the inspection socket 6 is disposed between the first shuttle 4 and the second shuttle 5.

As shown in FIG. 1, the inspection socket 6 is a socket which is detachably installed in a socket installation section positioned substantially in a center portion of the region S of the handler and inspects the electrical properties of the IC devices 100 in this installed state. The inspection socket 6 is a plate-like member having a square shape in a plan view.

The inspection socket 6 includes four individual inspection sockets (loading sections) 61 each of which is configured with a recess capable of accommodating (loading) four IC devices 100 one by one. In the embodiment, the four individual inspection sockets 61 are formed in a matrix shape with 2 columns in the X direction and 2 rows in the Y direction.

A plurality of probe pins (not shown) are provided on each of the individual inspection sockets 61. When the IC device 100 is accommodated in and disposed on the individual inspection socket 61, each of the probe pins comes in contact with each of the electrodes (electrodes 100e) described above included in the IC device 100. This leads to a state in which the IC device 100 and the control device 10 are electrically connected to each other through the probe pins, that is, a state in which the inspection (test) of the electrical properties of the IC device 100 can be performed.

An array pitch of four individual inspection sockets 61 is substantially the same as an array pitch of four pockets formed in each of the trays 42, 43, 52, and 53. Accordingly, it is possible to smoothly transport the IC devices 100 between the trays 42, 43, 52, and 53 and the individual inspection sockets 61.

The supply robot 7 is a robot which transports the IC devices 100 accommodated in the supply tray 2 to the trays 42 and 52.

The supply robot 7 includes a support frame 72 supported by the base 11, a moving frame 73 which is supported by the support frame 72 and can reciprocate in the positive and negative Y directions with respect to the support frame 72, a hand unit support section 74 which is supported by the moving frame 73 and can reciprocate in the positive and negative X directions with respect to the moving frame 73, and four hand units 75 which are supported by the hand unit support section 74.

A rail 721 extending in the Y direction is formed on the support frame 72, and the moving frame 73 reciprocates in the Y direction along this rail 721. In addition, a rail (not shown) extending in the X direction is formed on the moving frame 73, and the hand unit support section 74 reciprocates in the X direction along this rail. The movement of the moving frame 73 with respect to the support frame 72 and the movement of the hand unit support section 74 with respect to the moving frame 73 are performed by a driving section (not shown) using a linear motor as a driving source, for example.

The four hand units 75 are arranged in a matrix shape with 2 columns in the X direction and 2 rows in the Y direction. Each hand unit 75 includes a holding section which holds the IC device 100 and a lifting device which can lift and lower the holding section in the Z direction. The holding section is configured with an adsorption nozzle, for example, and can adsorb and hold the IC device 100. The lifting device can be set as a device using a driving section which uses a linear motor as a driving source, for example.

The supply robot 7 transports the IC devices 100 from the supply tray 2 to the tray 42 as the following description. First, the hand units 75 are positioned on the supply tray 2. The holding section of each hand unit 75 is lowered to hold the IC device 100 accommodated in the supply tray 2 by the holding section. After lifting each holding section, each hand unit 75 is moved onto the tray 42. The holding section of each hand unit 75 is lowered to dispose the IC device 100 in the pocket 421 of the tray 42. Then, the adsorbed state of each holding section is released, each holding section is lifted, and accordingly the IC device 100 is released. Thus, the transportation of the IC devices 100 from the supply tray 2 to the tray 42 is completed. The transportation of the IC devices 100 from the supply tray 2 to the tray 52 can also be performed in the same manner as described above.

The inspection robot 9 is a robot which performs a supply operation and a removal operation with respect to the inspection socket 6, in a state shown in FIG. 4 in which the holding unit 20 is mounted thereto (hereinafter, referred to as a "mounted state").

The supply operation is an operation of holding the uninspected IC devices 100 accommodated in the trays 42 and 52 by the holding unit 20 in the mounted state, and transporting and supplying the IC devices to the individual inspection sockets 61 in a state of the inspection socket 6 where the IC devices 100 are not yet loaded, that is, the individual inspection sockets 61 in an empty state. It is possible to perform the electrical inspection on the inspection socket 6 with the supply operation.

The removal operation is an operation of holding the IC devices 100 which are subjected to the electrical inspection by the holding unit 20 in the mounted state, removing the IC devices from the individual inspection sockets 61 of the inspection socket 6, and transporting the IC devices to the trays 43 and 53.

The inspection robot 9 can perform positioning of the IC devices 100 with respect to the inspection socket 6 (individual inspection sockets 61) when transporting the IC devices 100 to the inspection socket 6 from the trays 42 and 52, and can press the IC devices 100 against the probe pins of the inspection socket 6 to apply predetermined inspection pressure to the IC devices 100 when disposing the IC devices 100 on the inspection socket 6 and performing the inspection of the electrical properties.

As shown in FIGS. 1 and 2, the inspection robot 9 includes a first frame 911 which is provided with respect to the base 11 in a fixed manner, a second frame 912 which is supported by the first frame 911 and can reciprocate in the Y direction with respect to the first frame 911, a first hand unit support section 913 and a secondhand unit support section 914 which are supported by the second frame 912 and can be lifted or lowered in the Z direction with respect to the second frame 912, four first hand units 92 which are supported by the first hand unit support section 913, and four second hand units 93 which are supported by the second hand unit support section 914.

A rail 911a extending in the Y direction is formed on the first frame 911, and the second frame 912 reciprocates in the positive and negative Y directions along the rail 911a. In addition, rails 912a and 912b extending in the Z direction are formed on the second frame 912, the first hand unit support section 913 reciprocates in the positive and negative Z directions along the rail 912a, and the second hand unit support section 914 reciprocates in the positive and negative Z directions along the rail 912b.

The first hand unit support section 913 and the second hand unit support section 914 integrally move in the X direction and the Y direction as both of them are supported by the second frame 912, but each of them can separately move in the Z direction. The movement of the second frame 912 with respect to the first frame 911 and the movement of each of the hand unit support sections 913 and 914 with respect to the second frame 912 are performed by a driving section (not shown) using a linear motor as a driving source, for example.

The four first hand units 92 are disposed at a lower side of the first hand unit support section 913, in a matrix shape with 2 columns in the X direction and 2 rows in the Y direction. An array pitch of four first hand units 92 is substantially the same as the array pitch of the four pockets 421 and 431 formed on the trays 42 and 43 and the four individual inspection sockets 61 provided on the inspection socket 6.

As described above, by disposing the first hand units 92 so as to correspond to the arrangement of the pockets 421 and the individual inspection sockets 61, it is possible to smoothly perform transportation of the IC devices 100 between the trays 42 and 43 and the inspection socket 6.

In the same manner as described above, the four second hand units 93 are devices which transport the IC devices 100 between each of the trays 52 and 53 of the second shuttle 5 and the inspection socket 6. In addition, the second hand units are devices which perform positioning of the IC devices 100 with respect to the inspection socket 6, when transporting the uninspected IC devices 100 to the inspection socket 6 from the tray 52.

The four second hand units 93 are disposed at a lower side of the second hand unit support section 914, in a matrix shape with 2 columns in the X direction and 2 rows in the Y direction. Arrangement or an array pitch of the four second hand units 93 is the same as that of the four first hand units 92 described above. As described above, by disposing the second hand units 93 so as to correspond to the arrangement of the pockets 521 and the individual inspection sockets 61, it is possible to more smoothly perform transportation of the IC devices 100 between the trays 52 and 53 and the inspection socket 6.

Hereinafter, the configurations of the first hand units 92 and the second hand units 93 will be described. However, since the hand units 92 and 93 have the same configuration as each other, hereinafter, one of the firsthand units 92 will be described as a representative, and the description of the other first hand units 92 and the second hand units 93 will be omitted.

As shown in FIG. 3, the first hand unit 92 includes a support section 94 which is supported by and fixed to the first hand unit support section 913, a first moving section 95 which is supported by the support section 94 and can reciprocate in the positive and negative X directions with respect to the support section 94, a second moving section 96 which is supported by the first moving section 95 and can reciprocate in the positive and negative Y directions with respect to the first moving section 95, and a rotating section 97 which is supported by the second moving section 96 and can be rotated around the Z axis with respect to the second moving section 96. The rotating section 97 also functions as a holding unit mounting section on which the holding unit 20 is detachably mounted. A device mark 941 for performing positioning of the IC devices 100 held by the holding unit 20 in the mounted state with respect to the individual inspection sockets 61, is provided on the support section 94.

In addition, the first hand unit 92 includes a first driving mechanism (not shown) which causes the first moving section 95 to reciprocate in the positive and negative X directions with respect to the support section 94, a second driving mechanism (not shown) which causes the second moving section 96 in the positive and negative Y directions with respect to the first moving section 95, and a third driving mechanism which causes the rotating section 97 to be rotated around the Z axis with respect to the second moving section 96. The first, second, and third driving mechanisms use a linear motor as a driving source, for example, and can have a configuration obtained by adding a rack gear and a pinion gear for converting rotational movement of the motor into linear movement, if necessary.

The collection robot 8 has the same configuration as the supply robot 7. That is, the collection robot 8 includes a support frame 82 supported by the base 11 and on which a rail 821 is formed, a moving frame 83 which is supported by the support frame 82 and can reciprocate in the Y direction with respect to the support frame 82, a hand unit support section 84 which is supported by the moving frame 83 and can reciprocate in the X direction with respect to the moving frame 83, and a plurality of hand units 85 which are supported by the hand unit support section 84. The configuration of each section is the same as that of each section corresponding to the supply robot 7 and therefore the description thereof will be omitted.

The collection robot 8 transports the IC devices 100 from the tray 43 to the collection tray 3 as the following description. First, the hand units 85 are positioned on the tray 43. The holding section of each hand unit 85 is lowered to hold the IC device 100 accommodated in the tray 43 by the holding section. After lifting each holding section, each hand unit 85 is moved onto the collection tray 3. The holding section of each hand unit 85 is lowered to dispose the IC device 100 in the pocket 31 of the collection tray 3. Then, the adsorbed state of each holding section is released, each holding section is lifted, and accordingly the IC device 100 is released. Thus, the transportation of the IC devices 100 from the tray 43 to the collection tray 3 is completed. The transportation of the IC devices 100 from the tray 53 to the collection tray 3 can also be performed in the same manner as described above.

Herein, defective goods in which predetermined electrical properties cannot be exhibited may exist in the inspected IC devices 100 accommodated in the tray 43 (or tray 53). Therefore, for example, two collection trays 3 may be prepared to use one of them as a tray for accommodating non-defective goods which satisfy the predetermined electrical properties and use the other one as a tray for collecting the defective goods. In a case of using one collection tray 3, the predetermined pocket 31 may be used as a pocket for accommodating the defective goods. Therefore, it is possible to clearly classify the non-defective and defective goods.

The display device 800 is disposed on the negative Y direction side which is a front surface side of the inspection apparatus 1 (handler). This display device 800 includes a liquid crystal monitor, for example, and can display results of the electrical inspection or results of inspection remaining, for example. This liquid crystal monitor includes a touch panel function and is also used as a manipulation section which performs setting of the operations with respect to the inspection apparatus 1.

The control device 10 includes a driving control section 102, an inspection control section 101, and a storage section 103.

The driving control section 102 controls the movement of the supply tray 2, the collection tray 3, the first shuttle 4, and the second shuttle 5, or the mechanical driving of the supply robot 7, the collection robot 8, the inspection robot 9, and the like, for example.

The inspection control section 101 performs the inspection of the electrical properties of the IC devices 100 disposed on the inspection socket 6 based on a program stored in the storage section 103.

In the inspection apparatus 1, a central processing section (CPU) embedded in the inspection apparatus 1 functions as the inspection control section 101 or the driving control section 102.

The storage section 103 includes a CPU-readable storage medium (recording medium) which stores (records) a program, data, or the like. This storage medium is configured with a magnetic or optical recording medium such as a hard disk (HD) or compact disk read-only memory (CD-ROM), or a semiconductor memory.

Next, operation states of the inspection apparatus 1 will be described with reference to FIGS. 7 to 15.

Figure 7:
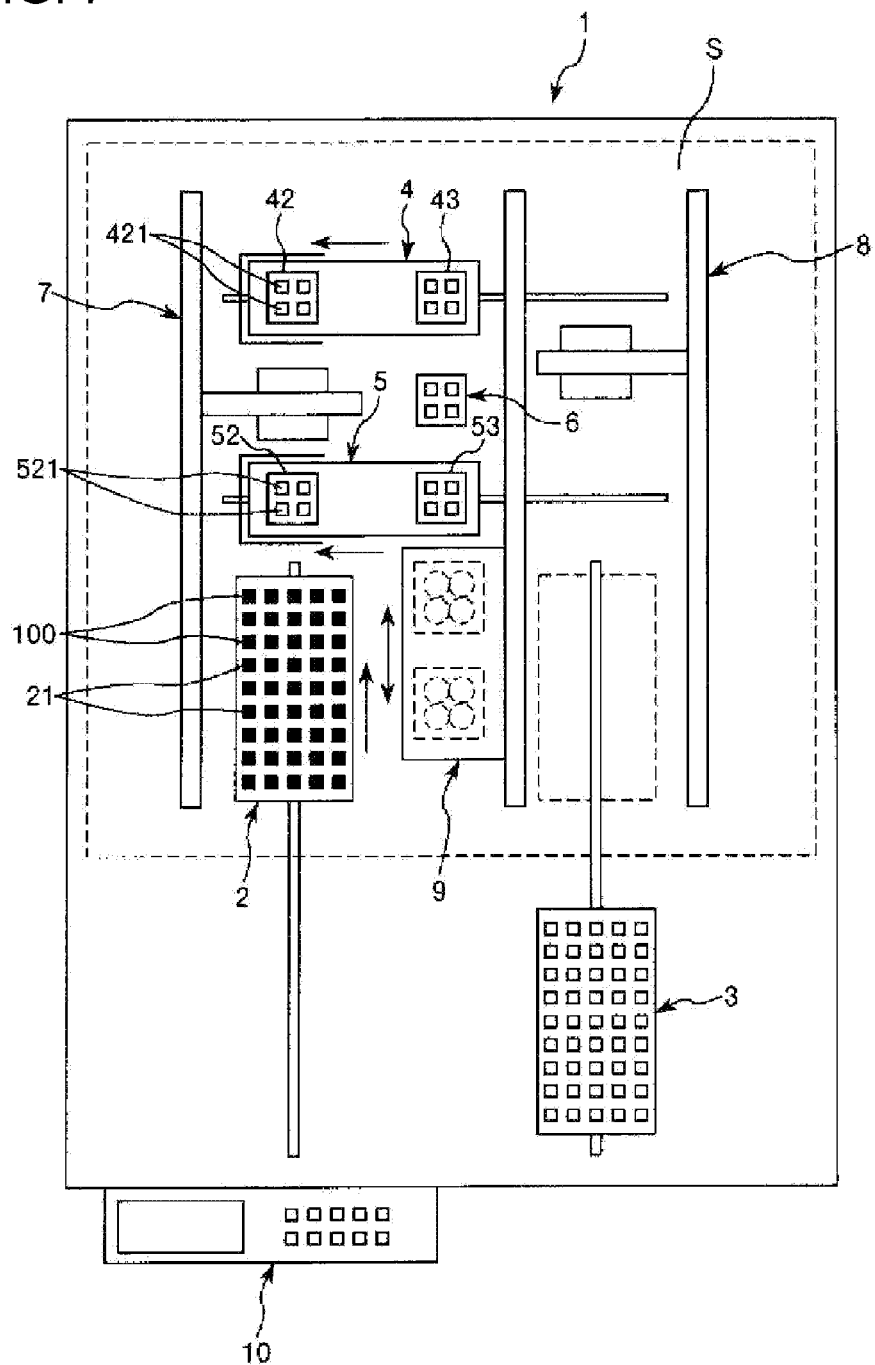
FIG. 7 is a plan view illustrating an inspection procedure of an electronic component performed by an inspection apparatus shown in FIG. 1.

First, as shown in FIG. 7, the supply tray 2 in which the IC device 100 is accommodated in each pocket 21 is transported into the region S, the first shuttle 4 and the second shuttle 5 are moved to the negative X direction side, and this leads to a state in which the tray 42 and the tray 52 are arranged on the positive Y direction side with respect to the supply tray 2.

Figure 8:
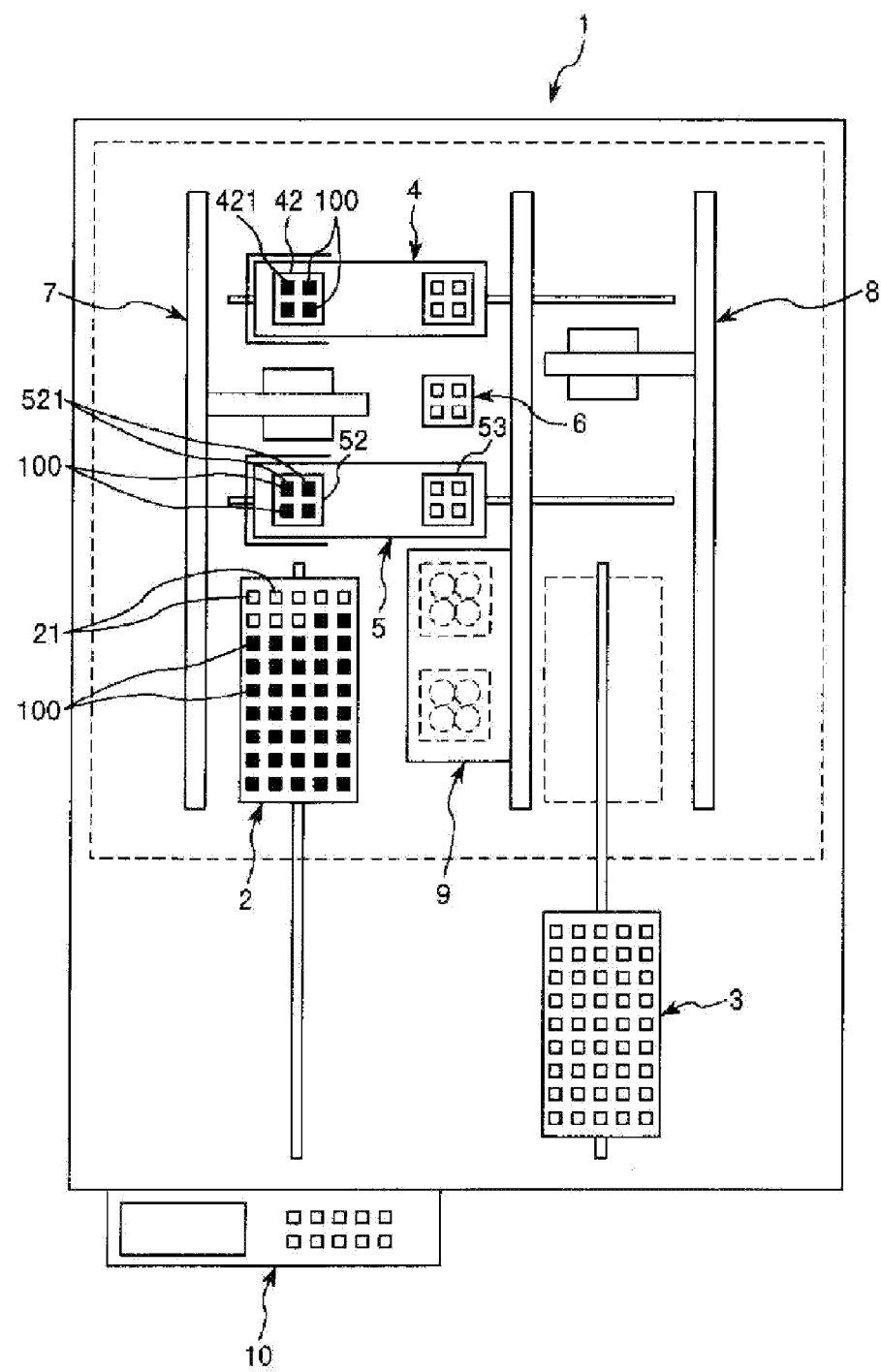
FIG. 8 is a plan view illustrating an inspection procedure of an electronic component performed by an inspection apparatus shown in FIG. 1.

Then, as shown in FIG. 8, by the supply robot 7, the IC devices 100 accommodated in the supply tray 2 are transferred to the trays 42 and 52 and the IC devices 100 are accommodated in pockets 421 and 521 of trays 42 and 52, respectively.

Figure 9:
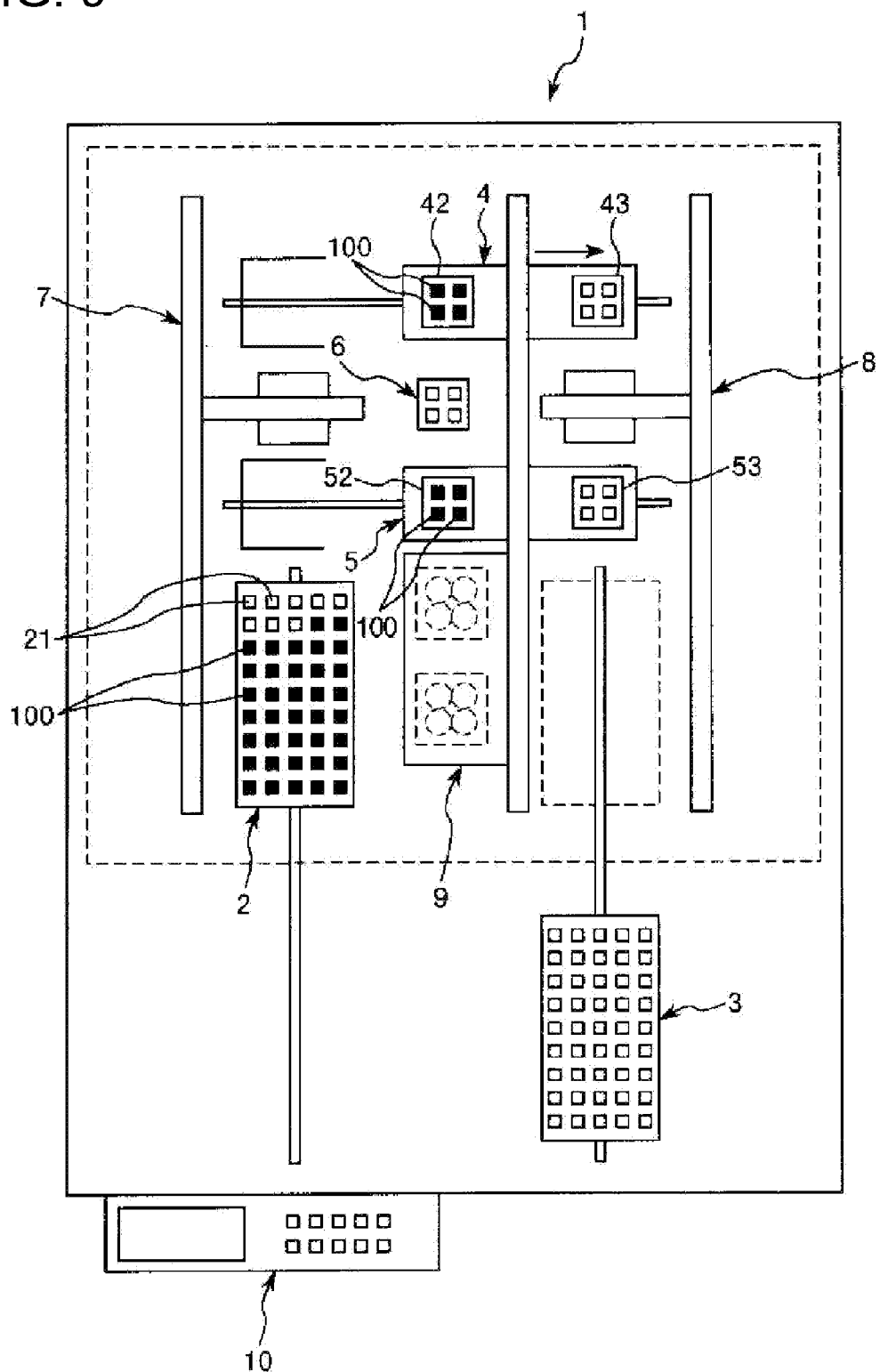
FIG. 9 is a plan view illustrating an inspection procedure of an electronic component performed by an inspection apparatus shown in FIG. 1.

Next, as shown in FIG. 9, both the first shuttle 4 and the second shuttle 5 are moved to the positive X direction side, and this leads to a state in which the tray 42 is arranged on the positive Y direction side with respect to the inspection socket 6 and the tray 52 is arranged in the negative Y direction side with respect to the inspection socket 6.

Figure 10:
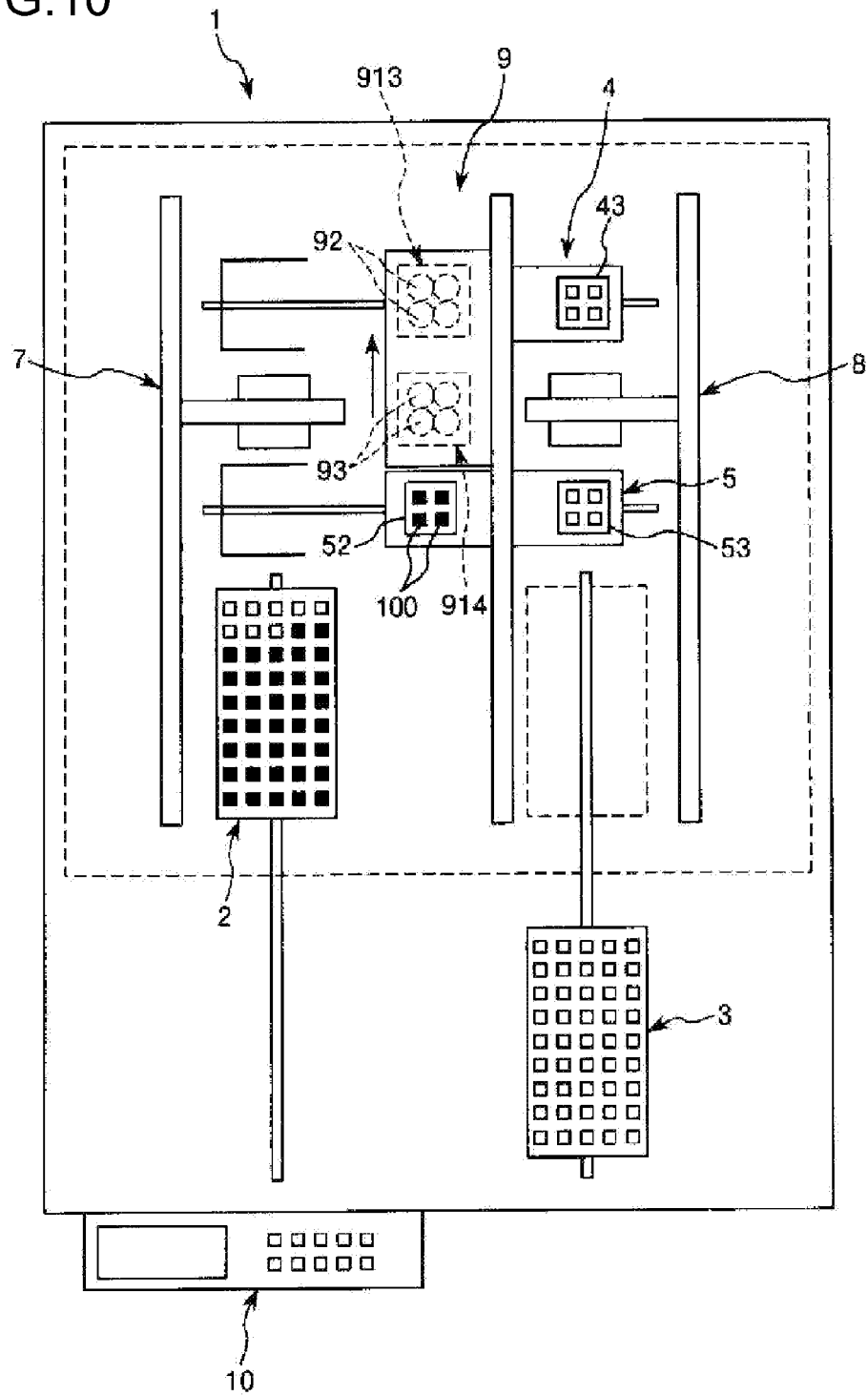
FIG. 10 is a plan view illustrating an inspection procedure of an electronic component performed by an inspection apparatus shown in FIG. 1.

Then, as shown in FIG. 10, the first hand unit support section 913 and the second hand unit support section 914 are integrally moved to the positive Y direction side, and this leads to a state in which the first hand unit support section 913 is positioned directly on the tray 42 and the second hand unit support section 914 is positioned directly on the inspection socket 6. After that, the IC devices 100 accommodated in the tray 42 are held by each of the first hand units 92.

Figure 11:
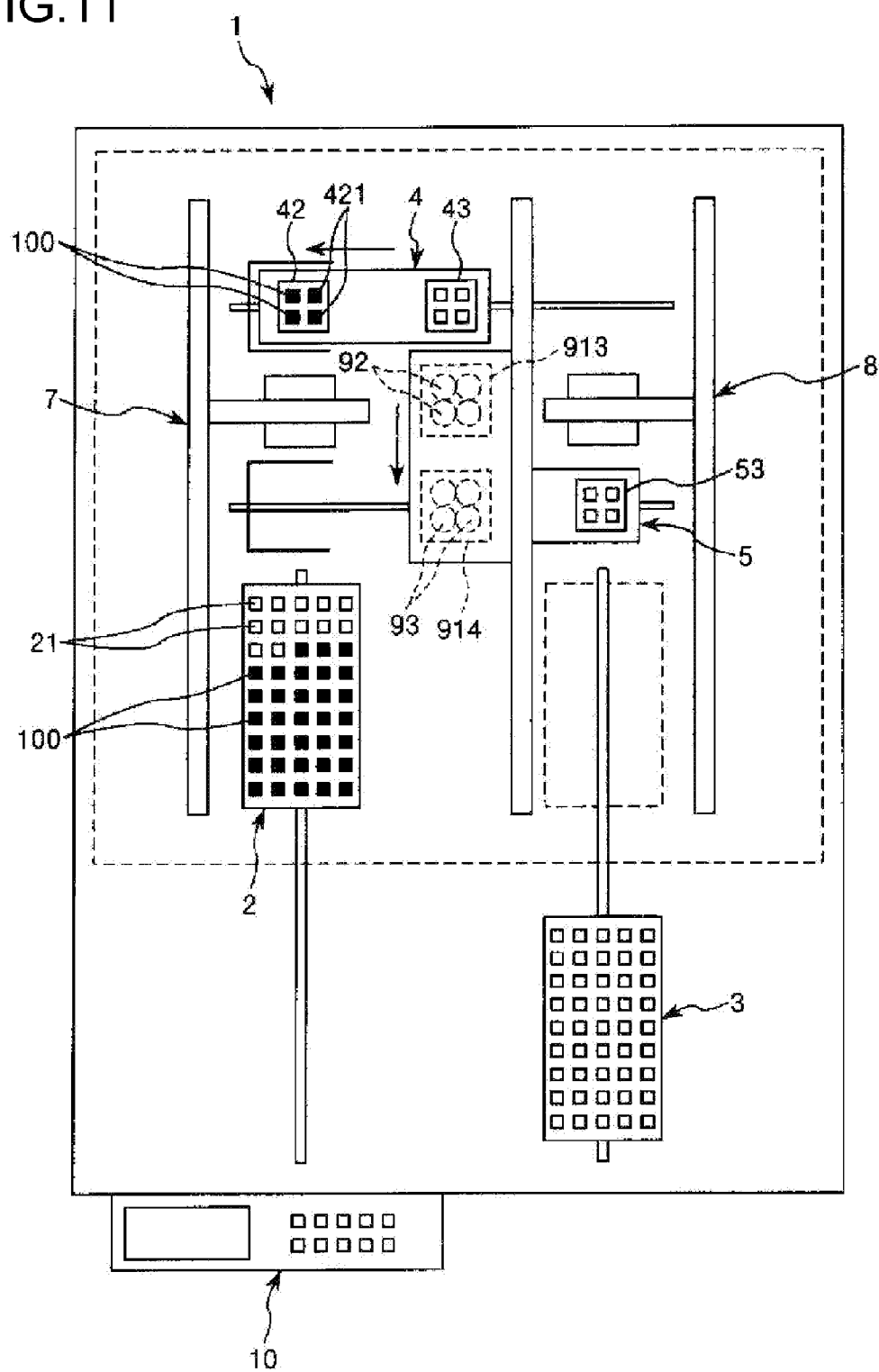
FIG. 11 is a plan view illustrating an inspection procedure of an electronic component performed by an inspection apparatus shown in FIG. 1.

Then, as shown in FIG. 11, the first hand unit support section 913 and the second hand unit support section 914 are integrally moved to the negative Y direction side, and this leads to a state in which the first hand unit support section 913 is positioned directly on the inspection socket 6 (inspection starting position) and the second hand unit support section 914 is positioned directly on the tray 52.

The following operations are also performed in line with the movement of the first hand unit support section 913 and the second hand unit support section 914. First, the first shuttle 4 is moved to the negative X direction side, and this leads to a state in which the tray 43 is arranged in the positive Y direction with respect to the inspection socket 6 and a state in which the tray 42 is arranged in the positive Y direction with respect to the supply tray 2. Then, the IC devices 100 accommodated in the supply tray 2 are transferred to the tray 42 by the supply robot 7, and the IC devices 100 are accommodated in each pocket 421 of the tray 42.

Next, the first hand unit support section 913 is lowered to dispose the IC devices 100 held by the first hand units 92 in the individual inspection sockets 61 of the inspection socket 6. That is, the supply operation is performed. At that time, each of the first hand units 92 presses the IC device 100 against the individual inspection socket 61 with predetermined inspection pressure (pressure). This leads to a state in which the electrodes of the IC device 100 and the probe pins provided on the individual inspection socket 61 are electrically connected to each other, and in this state, the inspection of the electrical properties with respect to the IC devices 100 in the individual inspection sockets 61 is executed by the inspection control section 101 of the control device 10.

When the electrical inspection ends, the first hand unit support section 913 is lifted to extract the IC devices 100 held by the first hand units 92 from the individual inspection sockets 61. That is, the removal operation is performed.

In line with such an operation (electrical inspection with respect to the IC devices 100), the secondhand units 93 supported by the second hand unit support section 914 hold the IC devices 100 accommodated in the tray 52, and the IC devices 100 are extracted from the tray 52.

Figure 12:
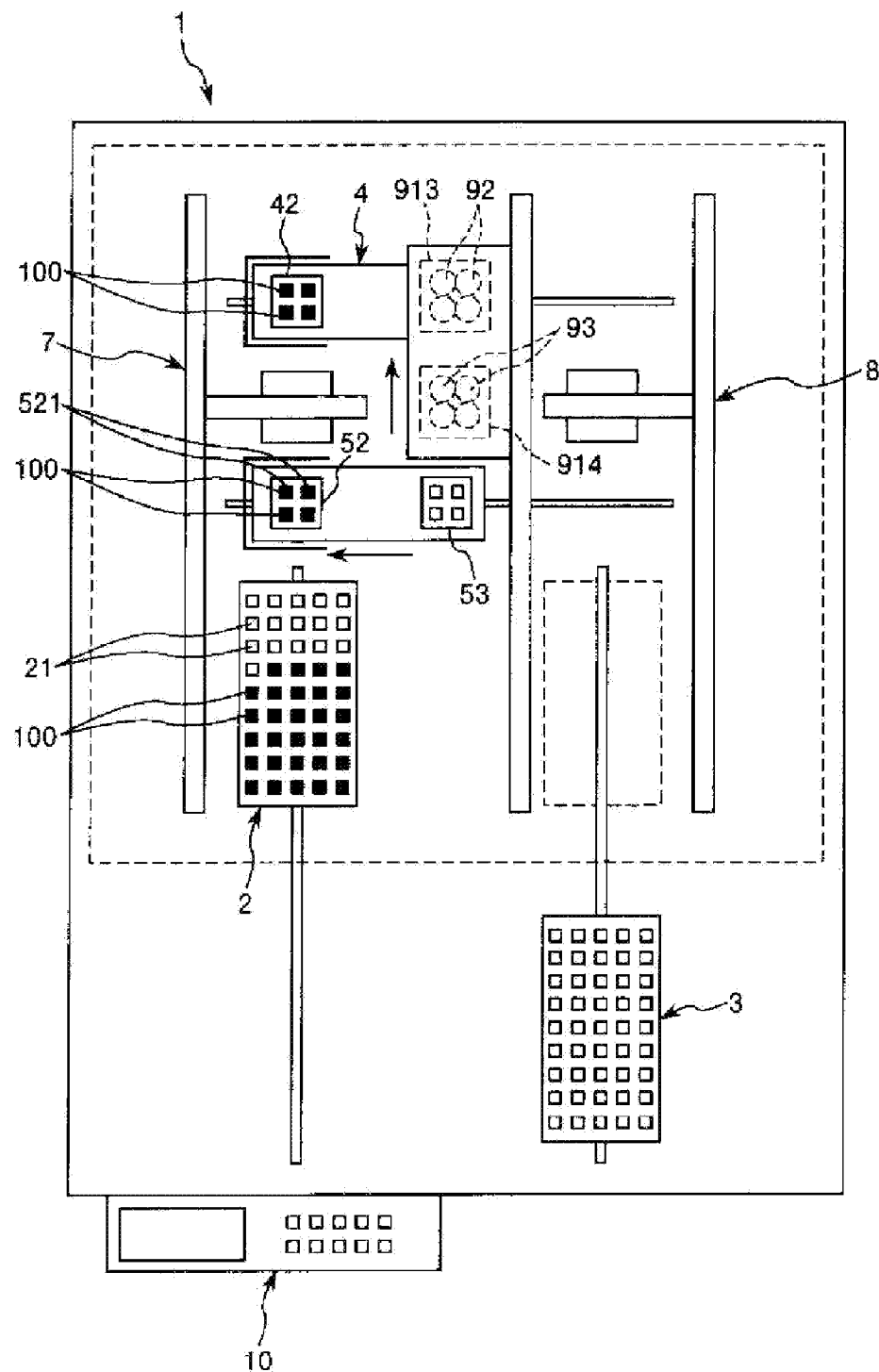
FIG. 12 is a plan view illustrating an inspection procedure of an electronic component performed by an inspection apparatus shown in FIG. 1.

Next, as shown in FIG. 12, the first hand unit support section 913 and the second hand unit support section 914 are moved to the positive Y direction side, and this leads to a state in which the first hand unit support section 913 is positioned directly on the tray 43 of the first shuttle 4 and the second hand unit support section 914 is positioned directly on the inspection socket 6 (inspection starting position).

The following operations are also performed in line with the movement of the first hand unit support section 913 and the second hand unit support section 914. First, the second shuttle 5 is moved to the negative X direction side, and this leads to a state in which the tray 53 is arranged in the negative Y direction with respect to the inspection socket 6 and a state in which the tray 52 is arranged in the positive Y direction with respect to the supply tray 2. Then, the IC devices 100 accommodated in the supply tray 2 are transferred to the tray 52 by the supply robot 7, and the IC devices 100 are accommodated in each pocket 521 of the tray 52.

Figure 13:
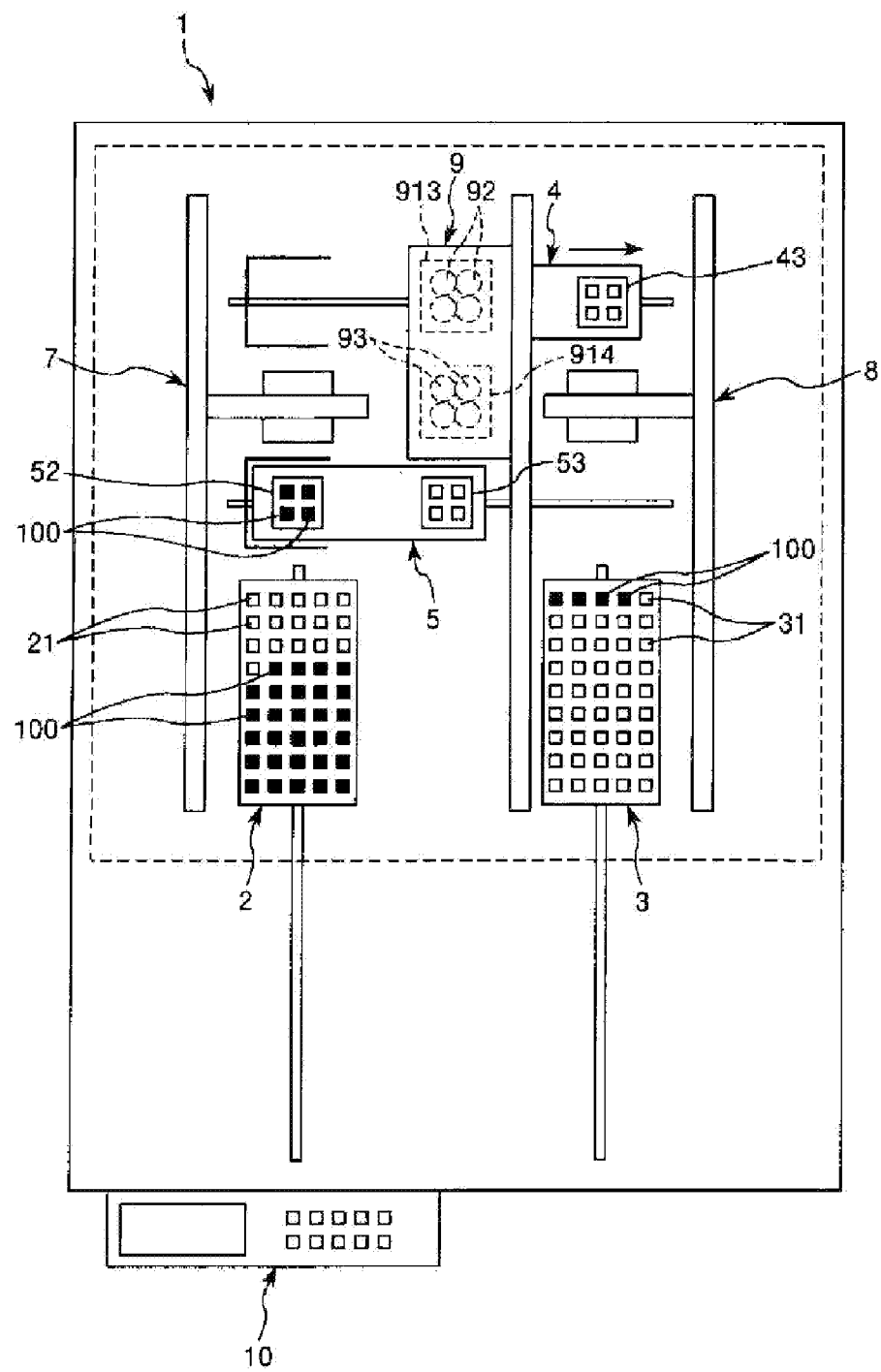
FIG. 13 is a plan view illustrating an inspection procedure of an electronic component performed by an inspection apparatus shown in FIG. 1.

Next, as shown in FIG. 13, the second hand unit support section 914 is lowered to dispose the IC devices 100 held by the second hand units 93 in the individual inspection sockets 61 of the inspection socket 6. That is, the supply operation is performed. The inspection of the electrical properties with respect to the IC devices 100 in the individual inspection sockets 61 is executed by the inspection control section 101.

When the electrical inspection ends, the secondhand unit support section 914 is lifted to extract the IC devices 100 held by the second hand units 93 from the individual inspection sockets 61. That is, the removal operation is performed.

In line with such an operation, the following operation is performed. First, the inspected IC devices 100 held by the first hand units 92 are accommodated in pockets 431 of the tray 43. Next, the first shuttle 4 is moved to the positive X direction side, and this leads to a state in which the tray 42 is arranged in the positive Y direction with respect to the inspection socket 6 and is positioned directly below the first hand units 92, and a state in which the tray 43 is arranged in the positive Y direction with respect to the collection tray 3. After that, the first hand units 92 hold the IC devices 100 accommodated in the tray 42 and the inspected IC devices 100 accommodated in the tray 43 are transferred to the collection tray 3 by the collection robot 8.

Figure 14:
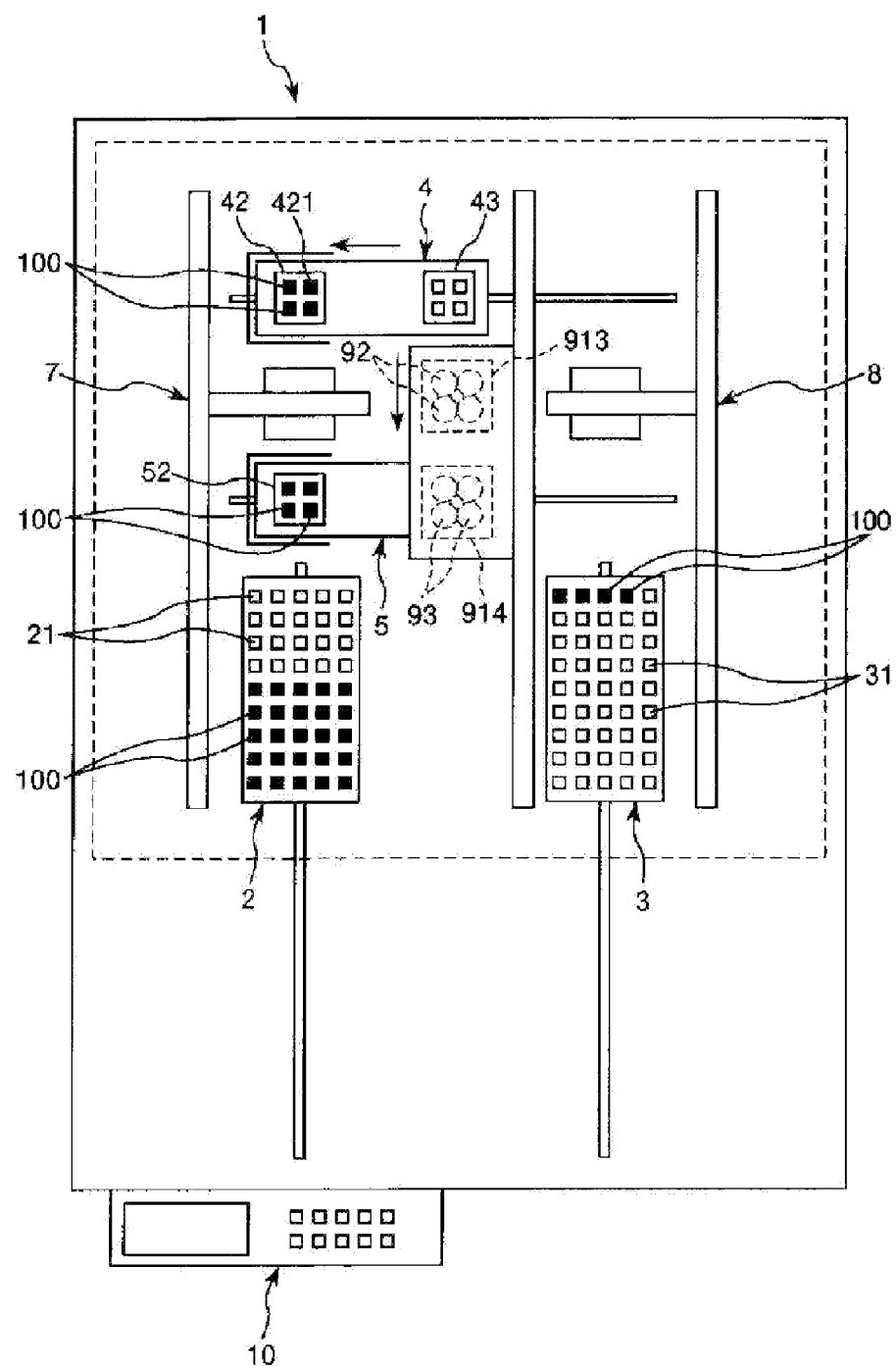
FIG. 14 is a plan view illustrating an inspection procedure of an electronic component performed by an inspection apparatus shown in FIG. 1.

Then, as shown in FIG. 14, the first hand unit support section 913 and the second hand unit support section 914 are moved to the negative Y direction side, and this leads to a state in which the first hand unit support section 913 is positioned directly on the inspection socket 6 (inspection starting position) and the second hand unit support section 914 is positioned directly on the tray 52.

The following operations are also performed in line with the movement of the first hand unit support section 913 and the secondhand unit support section 914. First, the first shuttle 4 is moved to the negative X direction side, and this leads to a state in which the tray 43 is arranged in the positive Y direction with respect to the inspection socket 6 and a state in which the tray 42 is arranged in the positive Y direction with respect to the supply tray 2. Then, the IC devices 100 accommodated in the supply tray 2 are transferred to the tray 42 by the supply robot 7, and the IC devices 100 are accommodated in each pocket 421 of the tray 42.

Figure 15:
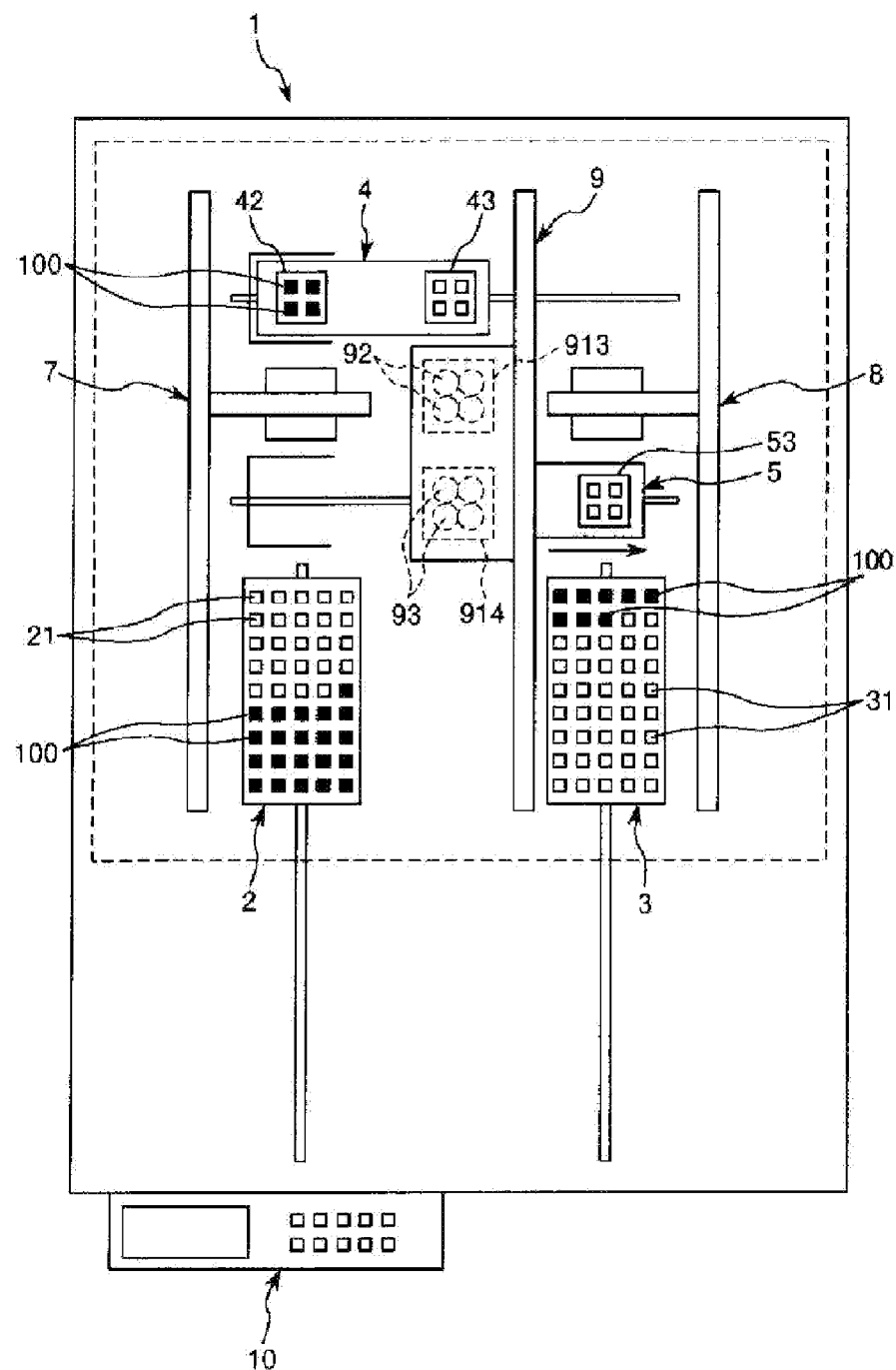
FIG. 15 is a plan view illustrating an inspection procedure of an electronic component performed by an inspection apparatus shown in FIG. 1.

After that, as shown in FIG. 15, the first hand unit support section 913 is lowered to dispose the IC devices 100 held by the first hand units 92 in the individual inspection sockets 61 of the inspection socket 6. The inspection of the electrical properties with respect to the IC devices 100 in the individual inspection sockets 61 is executed by the inspection control section 101. When the inspection ends, the first hand unit support section 913 is lifted to extract the IC devices 100 held by the first hand units 92 from the individual inspection sockets 61.

In line with such an operation, the following operation is performed. First, the inspected IC devices 100 held by the second hand units 93 are accommodated in pockets 531 of the tray 53. Next, the second shuttle 5 is moved to the positive X direction side, and this leads to a state in which the tray 52 is arranged in the negative Y direction with respect to the inspection socket 6 and is positioned directly below the second hand units 93, and a state in which the tray 53 is arranged in the positive Y direction with respect to the collection tray 3. After that, the second hand units 93 hold the IC devices 100 accommodated in the tray 52 and the inspected IC devices 100 accommodated in the tray 53 are transferred to the collection tray 3 by the collection robot 8.

Then, the operations shown in FIGS. 12 to 15 are repeated. When repeating the operations, if transferring all of the IC devices 100 accommodated in the supply tray 2 to the first shuttle 4 ends, the supply tray 2 is moved to the outside of the region S. Then, after new IC devices 100 are supplied to the supply tray 2 or the supply tray is exchanged with another supply tray 2 in which the IC devices 100 are already accommodated, the supply tray 2 is moved into the region S again. In the same manner as described above, when repeating the operations, if the IC devices 100 are accommodated in all pockets 31 of the collection tray 3, the collection tray 3 is moved to the outside of the region S. Then, after the IC devices 100 accommodated in the collection tray 3 are extracted or the collection tray 3 is exchanged with another empty collection tray 3, the collection tray 3 is moved into the region S again.

According to such a method, it is possible to efficiently perform the electrical inspection with respect to the IC devices 100. In detail, the inspection robot 9 includes the first hand units 92 and the second hand units 93. The IC devices 100 held by the first hand units 92 (same for the second hand units 93) are subjected to the electrical inspection in the inspection socket 6, for example, and in line with this state, the second hand units 93 move the IC devices 100 which are subjected to the electrical inspection to be accommodated in the tray 53 and then hold the IC devices 100 which are to be subsequently inspection objects to stand by. As described above, by performing different operations using the two hand units, it is possible to save wasting time and to efficiently perform the electrical inspection of the IC devices 100.

As described above, in the electrical inspection, the inspection may be performed by heating the IC devices 100. A configuration of heating the IC devices 100 will be described.

As shown in FIG. 4, the rotating section 97 of the inspection robot 9 includes a main body section 971, a heating flow path 972, and a heat generation section (heating element) 973, and these sections function as a heating section for heating the IC devices 100.

The main body section 971 is a part in which the heating flow path 972 and the heat generation section 973 are provided and includes a first plate member 974 and a second plate member 975 stacked on each other. Packing (not shown) is interposed between the first plate member 974 and the second plate member 975, and the first plate member 974 and the second plate member 975 are bonded to each other in this interposed state. A bonding method thereof is not particularly limited, and a method of fastening with a hexagonal socket bolt is used, for example.

The first plate member 974 and the second plate member 975 are configured with a material having relatively high thermal conductivity (hereinafter, also referred to as a "thermal conductive material"). The thermal conductive material is not particularly limited, and a metal material such as aluminum or alloy thereof or stainless steel can be used, for example.

As shown in FIG. 4, a groove 974b is formed on a lower surface 974a of the first plate member 974. A penetration hole 975c which penetrates the second plate member 975 from an upper surface 975a to a lower surface 975b, that is, penetrates the second plate member in a thickness direction is formed on the second plate member 975. The groove 974b and the penetration hole 975c communicate with each other, and they function as the heating flow path 972 through which fluid Q passes.

As shown in FIG. 5, the heating flow path 972 is bent (curved) in the middle thereof, that is, at a plurality of portions of the part configured with the groove 974b, and thus the heating flow path is generally meandered. Accordingly, it is possible to secure a maximum length of the path through which the fluid Q passes. The heat generation section 973 is disposed in the vicinity of the upper portion of the heating flow path 972 along a horizontal direction and intersects with the heating flow path 972 at a plurality of portions in a plan view (see FIG. 5). Thus, the fluid Q is sufficiently heated while passing through the meandered heating flow path 972, and this heated state is maintained, that is, prevented from being cooled until immediately before the fluid is supplied to the holding unit 20.

As shown in FIG. 4, the lower surface 975b of the second plate member 975 is an abutting surface on which an upper surface (abutting surface 205) of the holding unit 20 abuts in the mounted state. An opening portion of the heating flow path 972 (penetration hole 975c) opened to the lower surface 975b functions as a supply port 972a which supplies the fluid Q to the holding unit 20. Accordingly, it is possible to rapidly supply the fluid Q which is heated to have a predetermined temperature, to the holding unit 20.

As shown in FIG. 5, the heating flow path 972 (groove 974b) is opened to a side surface 974c of the first plate member 974, and an extended flow path 98a is provided to be extended from an opening portion 974d thereof towards an upstream side. The extended flow path 98a is configured with a tube having flexibility, for example.

A pump 991 as a fluid supply source which supplies the fluid Q to the heating flow path 972 through the extended flow path 98a is electrically connected to an uppermost stream end of the extended flow path 98a. The pump 991 is not particularly limited, and a non-positive displacement pump such as a centrifugal pump or a positive displacement pump such as a rotary pump can be used, for example. Accordingly, it is possible to supply compressed air as the fluid Q to make the compressed air reliably approach to the holding unit 20.

A solenoid valve 992 as a switching section which switches supply of the fluid Q from the pump 991 and stopping of the supply, is disposed in the middle of the extended flow path 98a, that is, between the pump 991 and the heating flow path 972. Accordingly, the solenoid valve switches so that the fluid Q is supplied (see FIGS. 4 and 6) when the holding unit 20 holds the IC devices 100 and the supply of the fluid Q is stopped when the holding unit 20 does not hold the IC devices 100. Thus, it is possible to prevent wasting of the fluid Q which continues to be supplied even when the holding unit 20 does not hold the IC devices 100.

The determination whether or not the holding unit 20 holds the IC devices 100 is performed using a proximity sensor which is installed on the rotating section 97, for example.

As shown in FIG. 4, in the first plate member 974, a recess 974f is formed on a portion between an upper surface 974e thereof and the groove 974b along the X direction. The heat generation section 973 can be inserted into and installed on the recess 974f.

The heat generation section 973 is embedded in the inspection apparatus 1, is electrically connected to a power supply unit 12 which supplies power, and generates heat by conduction of electricity. In the embodiment, the heat generation section 973 is configured with a rod heater having a rod-like shape. Accordingly, it is possible to easily control turning on and off of the heat generation section 973, that is, control the operating and stopping, and thus it is possible to heat the fluid Q which flows down the heating flow path 972, at predetermined timing.

The rotating section 97 includes a suction flow path (second flow path) 976 which is provided on the second plate member 975 separately from the heating flow path 972. The suction flow path 976 is opened to the lower surface 975b of the second plate member 975, and an opening portion thereof functions as a suction port 976a which sucks the inside of the holding unit 20. In addition, the suction flow path 976 is also opened to a side surface 975e of the second plate member 975, and an extended flow path 98b is provided to be extended from an opening portion 976b thereof. The extended flow path 98b is configured with a tube having flexibility, for example.

An ejector 993 as a suction section is connected to the extended flow path 98b in an airtight manner. The suction section is not limited to the ejector 993, and a vacuum pump can be used, for example.

As shown in FIGS. 4 and 6, the holding unit 20 includes a unit main body 201, and an adsorption member 202 which is mounted on the unit main body 201. As described above, the holding unit 20 is configured detachably with respect to the rotating section 97. An attaching and detaching method thereof is not particularly limited, and a method of fastening with a hexagonal socket bolt is used, for example.

A distal end portion of the unit main body 201 has a triple tube structure including a first tubular portion 201a, a second tubular portion 201b, and a third tubular portion 201c which are concentrically disposed with each other. The adsorption member 202 is mounted on a distal end portion of the third tubular portion 201c.

A gap between the first tubular portion 201a and the second tubular portion 201b is a first flow path 203a through which the fluid Q flows down. A gap between the second tubular portion 201b and the third tubular portion 201c is a second flow path 203b through which the fluid Q flows down.

A proximal end portion of the unit main body 201 has a block shape, and includes an abutting surface 205 which abuts the supply port 972a of the rotating section 97 in the mounted state. A distribution flow path 204 which communicates with the first flow path 203a and the second flow path 203b and distributes the fluid Q to the first flow path 203a and the second flow path 203b is provided on the proximal end portion of the unit main body 201 (see FIG. 4). The distribution flow path 204 includes an opening portion opened to the abutting surface 205, and the opening portion is a connection port 204a which is connected to the supply port 972a of the heating flow path 972 in the mounted state. Accordingly, the heating flow path 972 in the mounted state, and the first flow path 203a and the second flow path 203b communicate with each other through the distribution flow path 204.

A packing 206a having a ring shape so as to surround the connection port 204a is provided on the abutting surface 205. Accordingly, it is reliably prevent leakage of the fluid Q from a boundary portion of the supply port 972a of the heating flow path 972 in the mounted state and the connection port 204a of the distribution flow path 204.

An inner cavity portion of the third tubular portion 201c is a third flow path 203c including an opening portion 203d opened to the abutting surface 205. In the mounted state, the suction port 976a of the suction flow path 976 and the opening portion 203d of the third flow path 203c are connected to each other. Accordingly, the suction flow path 976 in the mounted state and an inner cavity portion 202a of the adsorption member 202 having a tubular shape communicate with each other through the third flow path 203c. The inner cavity portion 202a is sucked to be in a reduced pressure state (negative pressure state) with the operation of the ejector 993, and accordingly, it is possible to adsorb the upper surface 100f of the IC device 100 with the adsorption member 202 to hold the IC device 100. By operating the inspection robot 9 in this state, it is possible to transport the IC devices 100.

The adsorption member 202 is configured with an elastic material. In a case where quality of the adsorption member 202 is degraded due to long-term use, for example, the degraded adsorption member 202 can be extracted from the unit main body 201 to exchange with an unused adsorption member 202.

As shown in FIG. 6, in a state where the IC device 100 is adsorbed, an upper surface 100c of the first package 100a abuts a distal end surface 201e of the first tubular portion 201a and the upper surface 100f of the second package 100b abuts a distal end surface 201f of the second tubular portion 201b.

At least one groove 201g which is extended in the X direction is formed on the distal end surface 201e of the first tubular portion 201a. At least one groove 201h which is extended in the X direction is also formed on the distal end surface 201f of the second tubular portion 201b. The fluid Q which flows down through the first flow path 203a is discharged from the groove 201g, and the fluid Q which flows down through the second flow path 203b is discharged from the groove 201h by sequentially passing through the groove 201h and the first flow path 203a. Accordingly, unfavorable separation of the IC device 100 from the holding unit 20 by pressing of the fluid Q against the IC device 100 is prevented.

When performing the electrical inspection with the rotating section 97 and the holding unit 20 in a state of being mounted on the rotating section 97 having such configurations, it is possible to heat the IC device 100.

As shown in FIG. 4, the fluid Q passes through the heating flow path 972 of the rotating section 97 and is heated by the heat generation section 973 in the process of passing through. The heated fluid Q can flow into the distribution flow path 204 of the holding unit 20, that is, is supplied towards the holding unit 20 in a state as it is substantially without decreasing the temperature thereof. The fluid Q is divided into fluid to be supplied to the first flow path 203a and fluid to be supplied to the second flow path 203b. The fluid Q which flows down through the first flow path 203a blows to the first package 100a of the IC device 100, and the first package 100a can be preferentially heated. The fluid Q which flows down through the second flow path 203b blows to the second package 100b of the IC device 100, and the second package 100b can be preferentially heated.

The heat generated from the heat generation section 973 is transferred to the holding unit 20 through the main body section 971 of the rotating section 97 configured with a metallic material. The first package 100a of the IC device 100 is heated in the first tubular portion 201a and the second package 100b of the IC device 100 is heated in the second tubular portion 201b by the transferred heat.

It is possible to perform rapid and uniform heating with respect to the IC device 100, with a synergetic effect of the heating by the heated fluid Q and the heating by transferring. Accordingly, it is possible to perform the electrical inspection at a predetermined temperature.

It is possible to set the degrees of the heating with respect to the IC device 100 to be substantially equal to each other, in a state where the IC device 100 is adsorbed and lifted by the holding unit 20 and in a state where the IC device 100 is pressed into the inspection socket 6 with the holding unit 20.

The constituent elements for heating, that is, the heating flow path 972 and the heat generation section 973 are disposed in a concentrated manner in the rotating section 97. This configuration contributes to the supply of the heated fluid Q to the holding unit 20 substantially without being cooled.

By blowing of the fluid Q with respect to the IC device 100 at a plurality of portions, it is possible to rapidly and uniformly heat the IC device 100 regardless of the shape of the IC device 100.

Second Embodiment

Figure 16:
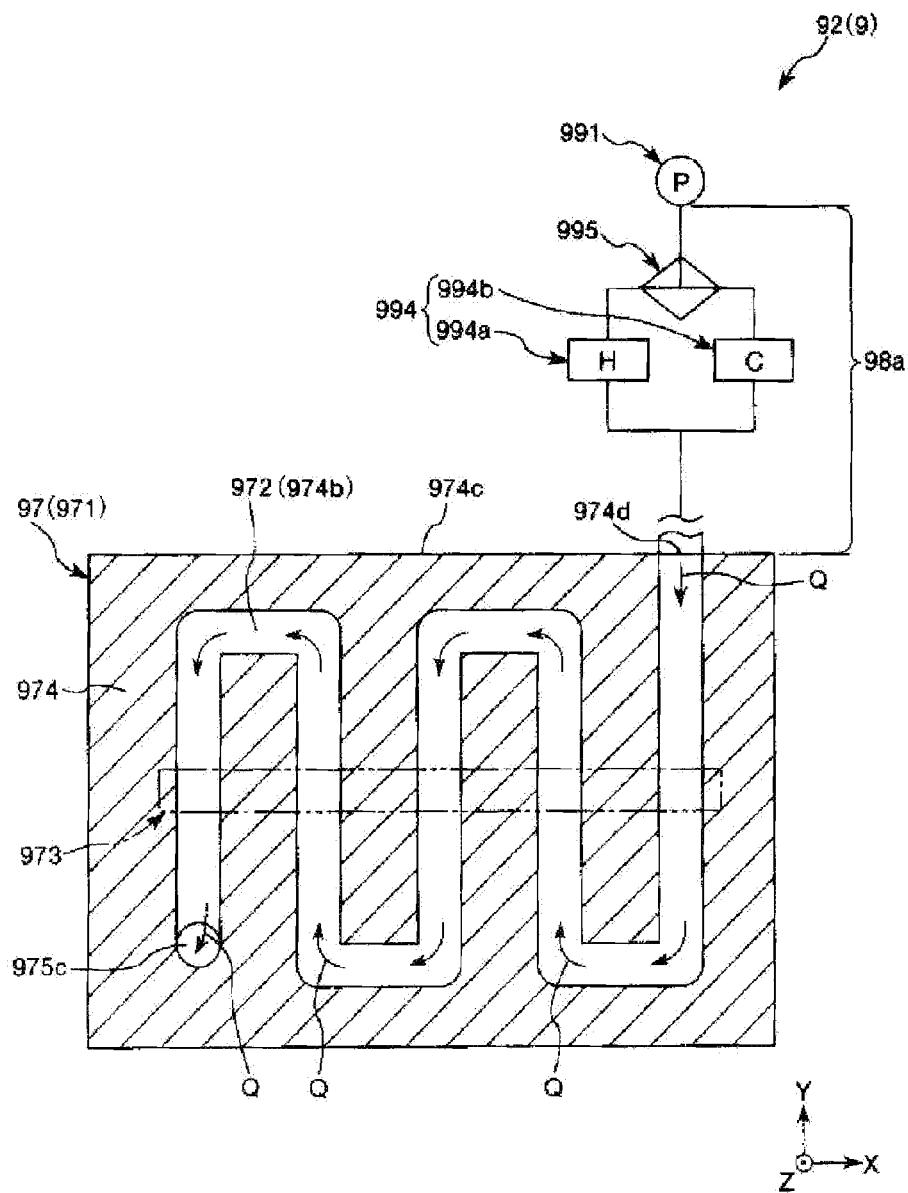
FIG. 16 is a transverse sectional view of a first hand unit included by an inspection robot of an inspection apparatus (handler (second embodiment)) according to the invention.

FIG. 16 is a transverse sectional view of a first hand unit included in an inspection robot of an inspection apparatus (handler (second embodiment)) according to the invention.

Hereinafter, the second embodiment of the handler and the inspection apparatus of the invention will be described with reference to the drawing, but will be described with a focus on differences from the embodiment described above, and the descriptions of the similar configurations will be omitted.

The embodiment is similar to the first embodiment except for further including a heat exchange section.

As shown in FIG. 16, in the embodiment, a heat exchange section 994 and a three-way stopcock 995 are disposed in the middle of the extended flow path 98a.

The heat exchange section 994 is configured with a heating section 994a and a cooling section 994b. The heating section 994a performs preheating with respect to the fluid Q before the fluid Q reaches the heating flow path 972, and a member which is the same as the heat generation section 973 can be used, for example. The cooling section 994b performs cooling with respect to the fluid Q before the fluid Q reaches the heating flow path 972, and a vortex tube which exhibits a vortex effect can be used, for example.

The three-way stopcock 995 is disposed on an upstream side of the heat exchange section 994. The three-way stopcock 995 can switch a state to three states. A first state is a state in which the fluid Q from the pump 991 is supplied to the heating section 994a side. A second state is a state in which the fluid Q from the pump 991 is supplied to the cooling section 994b side. A third state is a state in which the fluid is supplied to neither of the heating section 994a side and the cooling section 994b side, that is, a state in which the fluid Q from the pump 991 is stopped flowing down.

In a case where the heating in the heat generation section 973 is not sufficient, for example, it is possible to heat the fluid Q by the heating section 994a by setting the first state by the three-way stopcock 995.

In a case of performing the electrical inspection without operating the heat generation section 973, for example, the fluid Q blowing to the IC device 100 is preferably set to have a temperature lower than a room temperature. In this case, it is possible to cool the fluid Q by the cooling section 994b by setting the second state by the three-way stopcock 995.

Hereinabove, the handler and the inspection apparatus according to the invention have been described with the embodiments shown in the drawings, but the invention is not limited thereto, and each section configuring the handler and the inspection apparatus can be replaced with each section having an arbitrary configuration with the same function. In addition, arbitrary configurations may be added thereto.

The handler and the inspection apparatus according to the invention may be obtained by combining two or more arbitrary configurations (properties) from the embodiments.

The heating flow path is formed to be meandered in each embodiment, but the formation is not limited thereto, and the heating flow path may be formed to be wound helically.

As the heat generation section, the rod heater has been used in each embodiment, but the heat generation section is not limited thereto, and a coil heater or a surface heater may be used, for example.

What is claimed is:

1. A handler comprising:
    a holding unit mounting section in which a holding unit for holding a transportation object is mounted;
    a transportation mechanism which transports the transportation object held by the holding unit;
    a heater that is provided in the holding unit mounting section and that generates heat for heating fluid; and
    a first flow path that is provided in the holding unit mounting section, the fluid passing in the first flow path,
    wherein the fluid is used for heating of the transportation object,
    the holding unit mounting section includes a second flow path which is provided separately from the first flow path,
    the holding unit includes an adsorption member which has a tubular shape including an inner cavity, and adsorbs and holds the transportation object, and
    the inner cavity is connected to a suction member which sucks the inner cavity through the second flow path.

2. The handler according to claim 1,
    wherein the holding unit mounting section includes an abutting surface which abuts the holding unit, and
    the first flow path includes a supply port which is opened to the abutting surface and supplies the fluid to the holding unit.

3. The handler according to claim 1,
    wherein bent or curved portions are included in the middle of the first flow path.

4. The handler according to claim 1,
    wherein the first flow path is meandered.

5. The handler according to claim 1,
    wherein the holding unit mounting section includes a main body in which the first flow path and the heater are provided, and
    the heat generated by the heater is transferred to the holding unit through the main body to heat the transportation object.

6. The handler according to claim 1,
    wherein the heater generates the heat by conduction of electricity.

7. The handler according to claim 6,
    wherein the heater is in a rod-like shape and is disposed along a horizontal direction.

8. The handler according to claim 1, further comprising:
    a heat exchange section which is disposed on an upstream side of the first flow path, and performs heating or cooling with respect to the fluid before the fluid approaches the first flow path.

9. The handler according to claim 1, further comprising:
    a fluid supply source which supplies the fluid to the first flow path; and
    a switch which is disposed between the fluid supply source and the first flow path, and switches the supply or stopping of the supply of the fluid from the fluid supply source.

10. The handler according to claim 9,
    wherein the switch switches the state to a state in which the supply is performed, when the holding unit holds the transportation object.

11. The handler according to claim 1,
    wherein the fluid is compressed air.

12. The handler according to claim 1, further comprising:
    a socket installing portion which installs a socket for loading the transportation object,
    wherein the transportation mechanism is configured to transport the transportation object to the socket on which the transportation object is not yet loaded.

13. An inspection apparatus comprising:
    the handler according to claim 1; and
    a holding unit which is mounted on the holding unit mounting section.

14. An inspection apparatus comprising:
    the handler according to claim 2; and
    a holding unit which is mounted on the holding unit mounting section.

15. An inspection apparatus comprising:
    the handler according to claim 3; and
    a holding unit which is mounted on the holding unit mounting section.

16. An inspection apparatus comprising:
    the handler according to claim 4; and
    a holding unit which is mounted on the holding unit mounting section.

17. An inspection apparatus comprising:
    the handler according to claim 5; and
    a holding unit which is mounted on the holding unit mounting section.

18. An inspection apparatus comprising:
    the handler according to claim 6; and
    a holding unit which is mounted on the holding unit mounting section.

19. An inspection apparatus comprising:
    the handler according to claim 7; and
    a holding unit which is mounted on the holding unit mounting section.

* * * * *